US010629514B2

United States Patent
Arik et al.

(10) Patent No.: US 10,629,514 B2
(45) Date of Patent: Apr. 21, 2020

(54) HEAT SINK COOLING WITH PREFERRED SYNTHETIC JET COOLING DEVICES

(71) Applicant: OZYEGIN UNIVERSITESI, Istanbul (TR)

(72) Inventors: Mehmet Arik, Istanbul (TR);
Mohammed Ikhlaq, Istanbul (TR)

(73) Assignee: OZYEGIN UNIVERSITESI, Istanbul (TR)

( * ) Notice: Subject to any disclaimer, the term of this patent is extended or adjusted under 35 U.S.C. 154(b) by 63 days.

(21) Appl. No.: 15/511,175

(22) PCT Filed: Dec. 9, 2015

(86) PCT No.: PCT/TR2015/050241
§ 371 (c)(1),
(2) Date: Mar. 14, 2017

(87) PCT Pub. No.: WO2017/099677
PCT Pub. Date: Jun. 15, 2017

(65) Prior Publication Data
US 2018/0061737 A1    Mar. 1, 2018

(51) Int. Cl.
*H01L 23/433*    (2006.01)
*F04D 33/00*    (2006.01)
(Continued)

(52) U.S. Cl.
CPC ........... *H01L 23/467* (2013.01); *F04D 33/00* (2013.01); *F21V 29/60* (2015.01);
(Continued)

(58) Field of Classification Search
CPC .... H01L 23/4336; H01L 23/467; F04D 33/00
See application file for complete search history.

(56) References Cited

U.S. PATENT DOCUMENTS

| | | | | |
|---|---|---|---|---|
| 4,519,751 A | * | 5/1985 | Beckman | F04B 43/095 417/322 |
| 6,588,497 B1 | * | 7/2003 | Glezer | F15D 1/009 165/84 |

(Continued)

FOREIGN PATENT DOCUMENTS

| | | |
|---|---|---|
| CN | 202502450 U | 10/2012 |
| CN | 103175417 A | 6/2013 |
| EP | 2447992 A2 | 5/2012 |

OTHER PUBLICATIONS

International Search Report for corresponding International Application No. PCT/TR2015/050241.

*Primary Examiner* — Robert J Hoffberg
(74) *Attorney, Agent, or Firm* — Casimir Jones, S.C.; Lisa V. Mueller

(57) ABSTRACT

An assembly of synthetic jet devices is provided for cooling a heat sink. The assembly includes a mounting member for coupling to a heat sink including a plurality of fins, and a plurality of synthetic jet devices. Each of the plurality of synthetic jet devices includes an actuation module having a first actuator and a first plate opposite a second actuator and a second plate, and an extension module operably coupling the actuation module to the mounting member. Each actuation module of a synthetic jet device is configured to be suspended within a channel between two fins of the plurality of fins.

17 Claims, 14 Drawing Sheets

(51) Int. Cl.
  *F21V 29/60*    (2015.01)
  *H01L 23/473*   (2006.01)
  *H01L 23/467*   (2006.01)
  *H01L 23/40*    (2006.01)
  *H01L 23/36*    (2006.01)

(52) U.S. Cl.
  CPC ...... *H01L 23/4006* (2013.01); *H01L 23/4336* (2013.01); *H01L 23/4735* (2013.01); *H01L 23/36* (2013.01)

(56) References Cited

U.S. PATENT DOCUMENTS

| | | | | |
|---|---|---|---|---|
| 6,869,275 B2* | 3/2005 | Dante | ................ | F04B 43/046 251/129.06 |
| 7,252,140 B2* | 8/2007 | Glezer | ............... | H05K 7/20172 165/80.3 |
| 7,321,184 B2* | 1/2008 | Lee | .................. | F04D 33/00 310/328 |
| 7,607,470 B2* | 10/2009 | Glezer | ................ | H01L 23/427 165/104.33 |
| 7,760,499 B1* | 7/2010 | Darbin | ............... | H05K 7/20727 165/104.33 |
| 7,859,842 B2* | 12/2010 | Busch | ................ | H01L 23/467 165/185 |
| 7,990,705 B2* | 8/2011 | Bult | .................. | F15D 1/08 165/80.2 |
| 8,033,324 B2* | 10/2011 | Mukasa | ............ | F04F 7/00 165/121 |
| 8,081,454 B2* | 12/2011 | Ishikawa | .......... | F04F 7/00 165/122 |
| 8,083,157 B2* | 12/2011 | Arik | .................. | F23D 14/48 239/102.2 |
| 8,120,908 B2* | 2/2012 | Arik | .................. | G06F 1/20 165/185 |
| 8,325,477 B2* | 12/2012 | Ishikawa | .......... | F04F 7/00 165/80.3 |
| 8,430,644 B2* | 4/2013 | Mahalingam | ...... | F28F 13/02 165/104.33 |
| 8,434,906 B2* | 5/2013 | Arik | .................. | F21V 29/02 362/294 |
| 8,496,049 B2* | 7/2013 | Arik | ................ | H01L 23/467 165/80.3 |
| 8,581,471 B2* | 11/2013 | Tanaka | ............. | F04D 33/00 165/121 |
| 8,602,607 B2* | 12/2013 | Arik | ................ | F21V 23/006 362/294 |
| 8,776,871 B2* | 7/2014 | Arik | ................. | H05K 7/20172 165/121 |
| 8,881,994 B2* | 11/2014 | Wetzel | .............. | F15D 1/00 239/102.1 |
| 8,960,972 B2* | 2/2015 | Arik | ................ | F21V 29/02 362/373 |
| 9,119,246 B2* | 8/2015 | Arik | ................ | F21V 29/02 |
| 9,119,247 B2* | 8/2015 | Arik | ................ | F21V 29/02 |
| 9,215,520 B2* | 12/2015 | de Bock | ............ | H01L 41/0926 |
| 9,368,426 B2* | 6/2016 | Tanida | ............... | F04D 33/00 |
| 9,415,413 B2* | 8/2016 | Whalen | ............. | B05B 17/0638 |
| 9,423,106 B2* | 8/2016 | Arik | ................ | F21V 23/006 |
| 9,468,047 B2* | 10/2016 | Arik | ............... | F21V 29/02 |
| 9,474,183 B2* | 10/2016 | Arik | ................. | H05K 7/20172 |
| 9,474,184 B2* | 10/2016 | Arik | ................. | H05K 7/20172 |
| 9,478,479 B2* | 10/2016 | Arik | ................ | H01L 23/467 |
| 9,879,661 B2* | 1/2018 | Refai-Ahmed | ...... | F04B 17/03 |
| 10,085,363 B2* | 9/2018 | Refai-Ahmed | .... | H05K 7/20272 |
| 10,274,264 B2* | 4/2019 | Arik | ................. | F28F 3/022 |
| 2004/0190305 A1* | 9/2004 | Arik | ................. | F21V 29/02 362/555 |
| 2006/0185822 A1* | 8/2006 | Glezer | ............... | F04F 7/00 165/80.3 |
| 2006/0196638 A1* | 9/2006 | Glezer | ............... | F04F 7/00 165/80.3 |
| 2009/0262500 A1* | 10/2009 | Makino | ............. | H01L 23/4735 361/697 |
| 2010/0263838 A1* | 10/2010 | Mahalingam | ...... | F25D 17/02 165/104.31 |
| 2011/0168361 A1* | 7/2011 | Chao | ................ | F04B 43/04 165/121 |
| 2011/0174462 A1* | 7/2011 | Arik | ................ | F28F 3/022 165/96 |
| 2011/0277968 A1* | 11/2011 | Chao | ................ | F04B 43/043 165/120 |
| 2012/0098424 A1 | 4/2012 | Arik et al. | | |
| 2012/0140414 A1* | 6/2012 | Ishikawa | .......... | F04F 7/00 361/691 |
| 2012/0170216 A1 | 7/2012 | Arik et al. | | |
| 2013/0188307 A1* | 7/2013 | Mahalingam | ...... | F28F 13/02 361/679.46 |
| 2013/0239589 A1* | 9/2013 | Mahalingam | ...... | H01L 23/467 62/3.2 |
| 2013/0243030 A1* | 9/2013 | Mahalingam | ........ | G06F 1/20 374/101 |
| 2014/0002991 A1* | 1/2014 | Sharma | ............. | F21V 29/63 361/694 |
| 2014/0060783 A1 | 3/2014 | Ciulla et al. | | |
| 2014/0290916 A1* | 10/2014 | Arik | ................. | F28F 3/022 165/120 |
| 2014/0319239 A1* | 10/2014 | Mahalingam | ...... | H01L 23/467 239/102.2 |
| 2015/0342088 A1 | 11/2015 | Refai-Ahmed et al. | | |
| 2017/0040242 A1* | 2/2017 | Arik | ................ | H01L 23/467 |

* cited by examiner

HEAT SINK COOLING WITH PREFERRED SYNTHETIC JET COOLING DEVICES

BACKGROUND

The subject matter disclosed herein relates generally to synthetic jet devices, device packaging, and more particularly to the integration to heat sinks of modular suspended synthetic jet devices applicable to heat transfer systems.

Microchips, LEDs, radio frequency components, memory chips, and other electronic devices may generate a significant amount of heat during use. These electronic devices need to dissipate this heat in order to prevent damage and to extend their useful life. At times, the environment surrounding the electronic devices may be unable to provide the necessary cooling. In situations where the environment is unable to effectively cool the electronic device, a cooling device may be included. The cooling device, such as a heat sink, may therefore provide the necessary cooling in combination with the environment to extend the life and protect the electronic device.

Typically a very large surface area is required to remove high heat fluxes, especially in natural air convection. Prior active cooling apparatus and systems have disadvantageously suffered from large form factors and inefficiencies, mainly operating external to or outside of the structure in need of cooling, thereby increasing the form factor of the heat sink or structure to be cooled. Consequently, there is still a need in the art for cooling systems and apparatus that provide for a compact form factor, weight, and packaging of cooling devices with the device to be cooled, while also providing high heat transfer performance.

SUMMARY

The present disclosure relates to synthetic jet devices and methods of heat transfer in order to eliminate the above-mentioned problems and to bring new advantages to the related technical field.

In one embodiment, an assembly of synthetic jet devices is provided. The assembly includes a mounting member for coupling to a heat sink including a plurality of fins, and a plurality of synthetic jet devices operably coupled to the mounting member. Each of the plurality of synthetic jet devices includes an actuation module having a first actuator and a first plate opposite a second actuator and a second plate, and an extension module operably coupling the actuation module to the mounting member. Each actuation module of a synthetic jet device is configured to be suspended within a channel between two fins of the plurality of fins. Thus, the actuation module is embedded within the heat sink fins but does not touch a fin surface. In a further example, each actuation module of a synthetic jet device may be configured to be suspended within and between various arrays of pin fins.

In another embodiment, a heat transfer system is provided. The heat transfer system includes a heat sink having a plurality of fins, and an assembly of synthetic jet devices operably coupled to the heat sink. The assembly includes a mounting member operably coupled to the heat sink, and a plurality of synthetic jet devices operably coupled to the mounting member. Each of the synthetic jet devices has an actuation module and an extension module operably coupling the actuation module to the mounting member, and each of the plurality of synthetic jet devices is substantially suspended within a channel between two fins of the plurality of fins.

In yet another embodiment, a method of heat transfer includes providing a heat sink including a plurality of fins, providing a mounting member, and providing a plurality of synthetic jet devices as described above. The method further includes operably coupling a plurality of synthetic jet devices to the mounting member via the extension module, operably coupling the mounting member to the heat sink, and suspending each of the plurality of synthetic jet devices within a channel between two fins of the plurality of fins.

BRIEF DESCRIPTION OF DRAWINGS

These and other features, aspects, and advantages of the present invention will become better understood when the following detailed description is read with reference to the accompanying drawings in which like characters represent like parts throughout the drawings. Unless noted, the drawings may not be drawn to scale.

DESCRIPTION OF EMBODIMENTS

Embodiments of the invention generally relate to assemblies of synthetic jet devices for cooling heated bodies, including heat sinks thermally coupled to electronic devices. For example, an assembly of synthetic jet devices as described herein may provide convective cooling for heat sinks thermally coupled to LEDs, microchips, radio components, memory chips, and other applicable electronic devices. As discussed in detail below, the assemblies of synthetic jet devices as disclosed in the present disclosure advantageously provide for highly compact packaging of a heat sink by embedding synthetic jet devices within the space of the heat sink channels, which further advantageously provides highly efficient active cooling with greatly improved heat transfer. In the case of cooling LED lamps, the assembly of embedded synthetic jet devices advantageously allow for higher lumen extraction, higher lifetime of the LED and lamp, and lower costs.

In one embodiment, an assembly of synthetic jet devices includes a mounting member for coupling to a heat sink including a plurality of fins, and a plurality of synthetic jet devices mounted to the mounting member. Each of the plurality of synthetic jet devices includes an actuation module having a first actuator and a first plate opposite a second actuator and a second plate, and an extension module operably coupling the actuation module to the mounting member. Each actuation module of a synthetic jet device is configured to be suspended within a channel between two fins of the plurality of fins. In other words, the actuation module including one or more actuators (e.g., a piezoelectric element) and one or more actuated members (e.g., a plate or diaphragm), are generally suspended in the space or cavity between cooling fins, and thus the actuation module is not physically touching a fin wall, base, or a part of the heat sink. In one embodiment, the entire actuation module is substantially completely within the space or cavity of the channel walls (i.e., the actuation module is not protruding vertically or horizontally beyond the fin walls), and in another embodiment, the entire synthetic jet device including the actuation module and the extension module is substantially completely within the space or cavity created by the channel walls, thus advantageously providing a highly compact heat transfer apparatus.

Figure 1A:
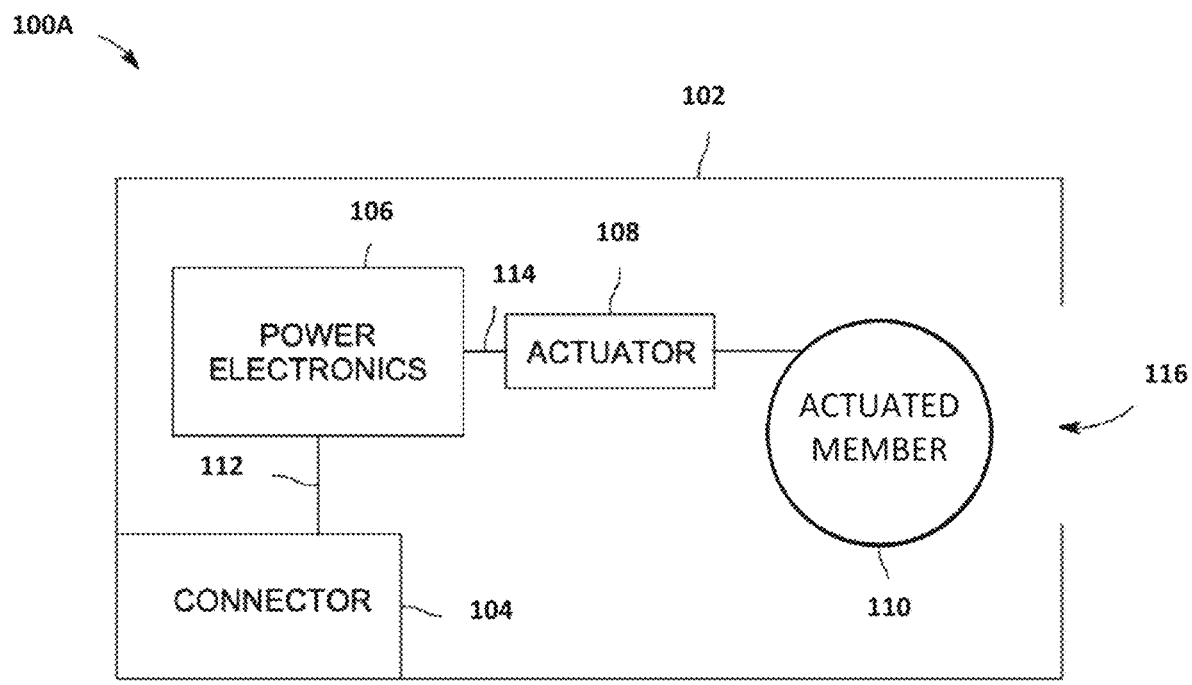
FIGS. 1A-1C are block diagrams of synthetic jet devices, in accordance with different embodiments disclosed herein.
Figure 1B:
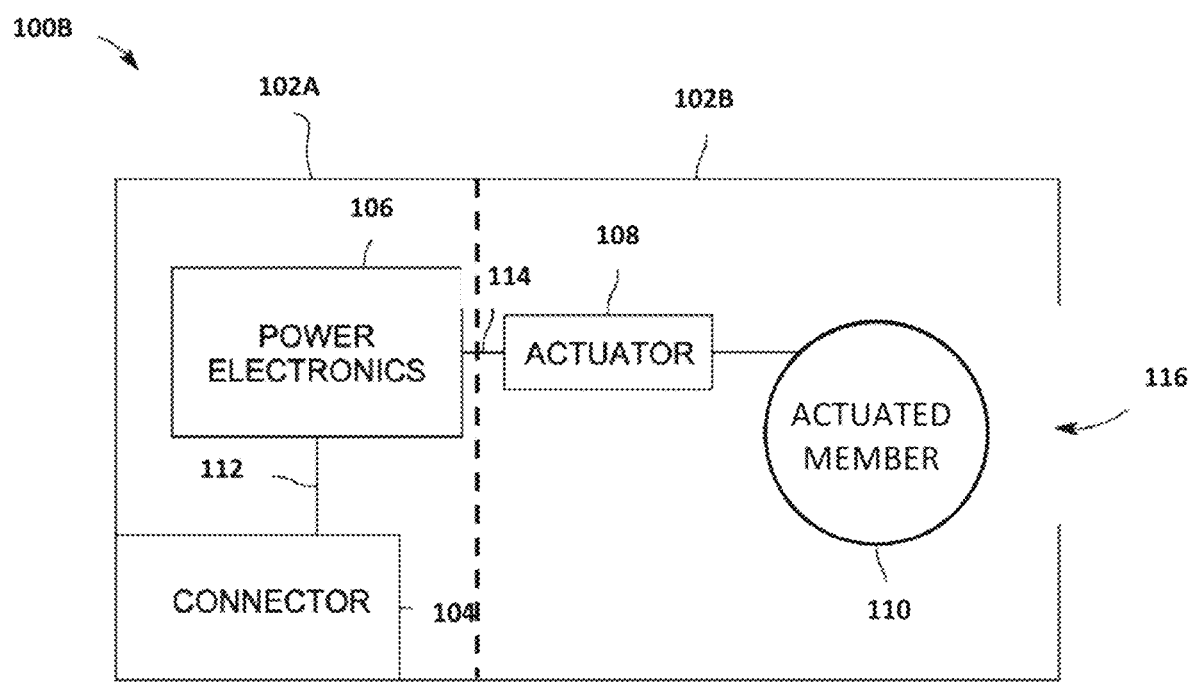
Figure 1C:
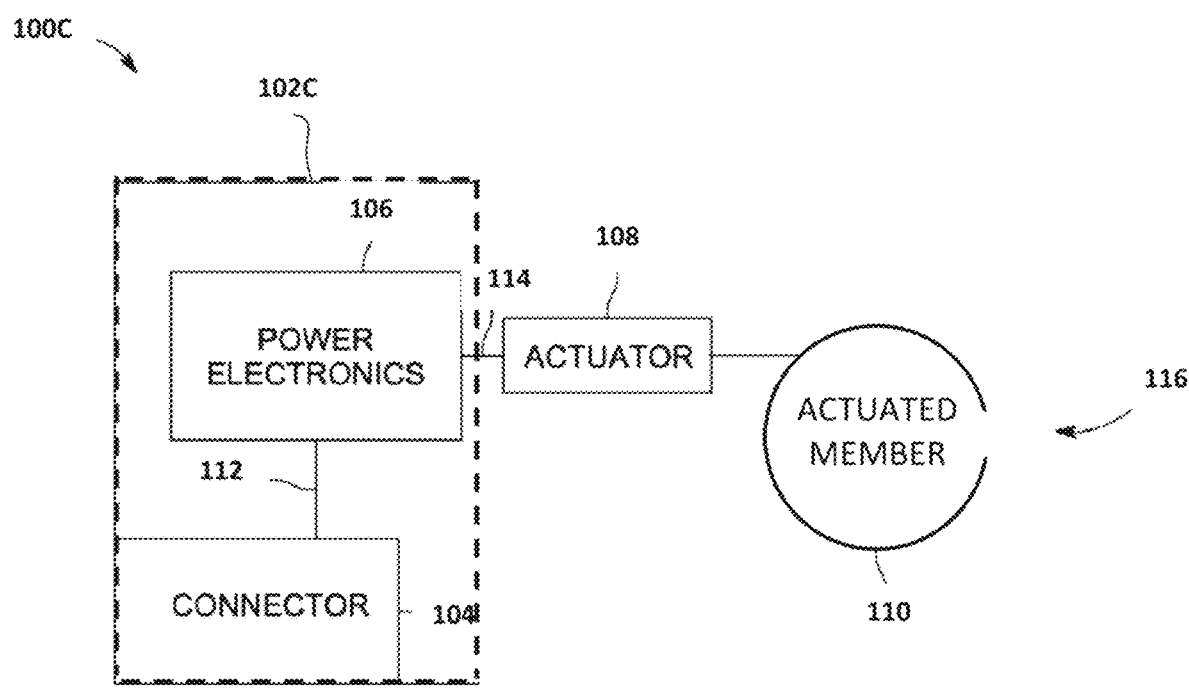

Referring now to FIGS. 1A, 1B, and 1C, block diagrams are shown of synthetic jet devices 100A, 100B, and 100C, respectively, that may be mounted to a mounting member, which in turn may be operably coupled to a heat sink, in accordance with embodiments as described herein. The synthetic jet device 100A includes a connector 104, power electronics 106, actuator 108, and actuated member 110. As seen in FIG. 1A, the synthetic jet device advantageously includes the connector 104, power electronics 106, one or more actuators 108, and one or more actuated member 110 within a housing 102, thus, creating a self-contained unit. By including all of these components in a single package, the synthetic jet device 100A may advantageously be inserted into an existing system or may be simply removed and replaced when damaged.

In accordance with another embodiment as described in the present disclosure and as illustrated in FIG. 1B, synthetic jet device 100B includes connector 104 and power electronics 106 formed as a separate extension module in a housing 102A, and actuator(s) 108 and actuated member(s) 110 are packaged as a separate actuation module in a housing 102B. The extension module and the actuation module will be in electrical communication (via electrical connectors) such that power electronics 106 can operably communicate with actuator 108. Advantageously, making components modular allows for advantageous repair or replacement of components when damaged. For example, if the actuation module becomes damaged, the extension module could be recovered and reused, and vice versa.

In accordance with yet another embodiment as illustrated in FIG. 1C, synthetic jet device 100C includes connector 104 and power electronics 106 which are placed within or on a housing 102C, which can include the motherboard, the extension member as further described below and herein, the mounting member as further described below and herein, or adjacent electronics of the device to be cooled. Actuator(s) 108 and actuated member(s) 110 with one or more spacers or frames can themselves form an air cavity for producing synthetic jets without another separate housing structure. In other words, one or more actuated members and a frame component may in themselves form an actuation module with an air cavity without the need for an exterior housing, thus providing a highly thin form factor as will be described further below and herein. Power electronics 106 can operably communicate with actuator 108 via wires 114 in one example.

During operation, the synthetic jet devices 100A, 100B, and 100C each receives power from an external source (not shown) through the connector 104. The external power supply may provide power in the form of alternating current (A/C) or direct current (D/C). The connector 104 passes this power on to power electronics 106 through an electrical connection 112. Connector 104 may include, in one embodiment, ports, prongs, a ribbon connector, and/or other means for electrical connection. In addition to its function as an electrical connector, the connector 104 may also function as a physical connector for mechanical integration to a cooled system. For example, the connector 104 may physically connect or mount the synthetic jet device 100A-100C in a system. Thus, the connector 104 may properly position the synthetic jet device 100A-100C to cool necessary components or locations in a system. Further, the connector 104 may facilitate electrical communication between the power electronics 106 and the system to which it attaches (e.g., a computer processor, a signal generator, or some other control system). Alternatively, the synthetic jet devices 100A-100C may be powered by a battery (not shown) in place of the connector 104, such that the power electronics 106 are powered by the battery, rather than an external source.

In one example, the power electronics 106 may be a general purpose integrated circuit, an application specific integrated circuit (ASIC), a logic processor, or a signal generator. For example, the power electronics 106 may include an ASIC designed specifically for the operation of the synthetic jet devices 100A-100C. During operation, the power electronics 106 control the timing and release of power to an actuator(s) 108 through an electrical connection 114. For example, during operation, the power electronics 106 may receive signals through the connector 104 indicating that the system, electrical component, etc., needs more or less cooling. Specifically, the power electronics 106 may receive a signal indicating the need for increased cooling. The power electronics 106 may then increase power and/or timing to the actuator 108 for movement of the actuated member 110. Likewise, if less cooling is required the power electronics 106 may slow the timing and/or decrease power to the actuator(s) 108. Thus, the power electronics may optimize the cooling flow while simultaneously saving power.

Actuated member 110 may be of various shape and material, including membranes and flexible plates. The actuator 108 may control movement of the actuated member 110 in a variety of ways. For example, the actuator 108 may drive a membrane or flexible plates with an electromagnetic actuator, a piezoelectric actuator, a mechanical actuator (i.e., piston), or other actuation means.

As the actuator 108 drives the actuated member 110, the actuated member 110 moves air out of the housing 102 through an aperture 116. As the air passes out of the housing 102 (or housing 102B or out of actuated member 110), the air creates a cooling convective airflow through a channel or over a specific location or component in a system. This convective airflow may assist in preventing premature wear, damage, etc. by supporting heat removal.

Figure 2A:
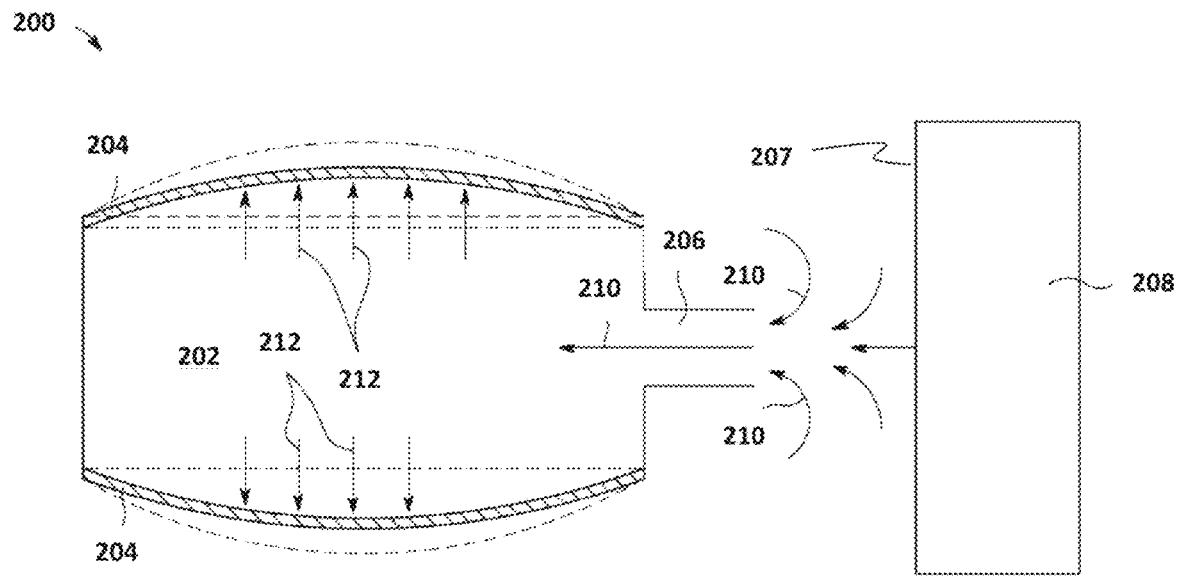
FIGS. 2A and 2B illustrate an example of a synthetic jet device expanding/ingesting air and compressing/expelling air, respectively.
Figure 2B:
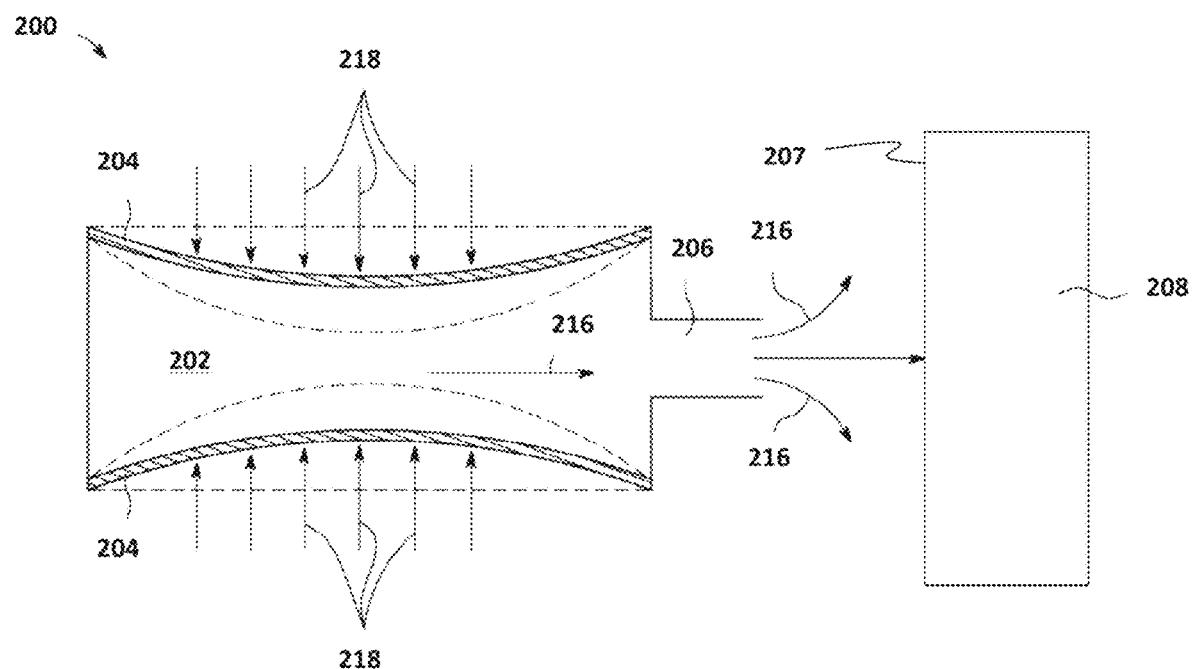
Figure 3A:
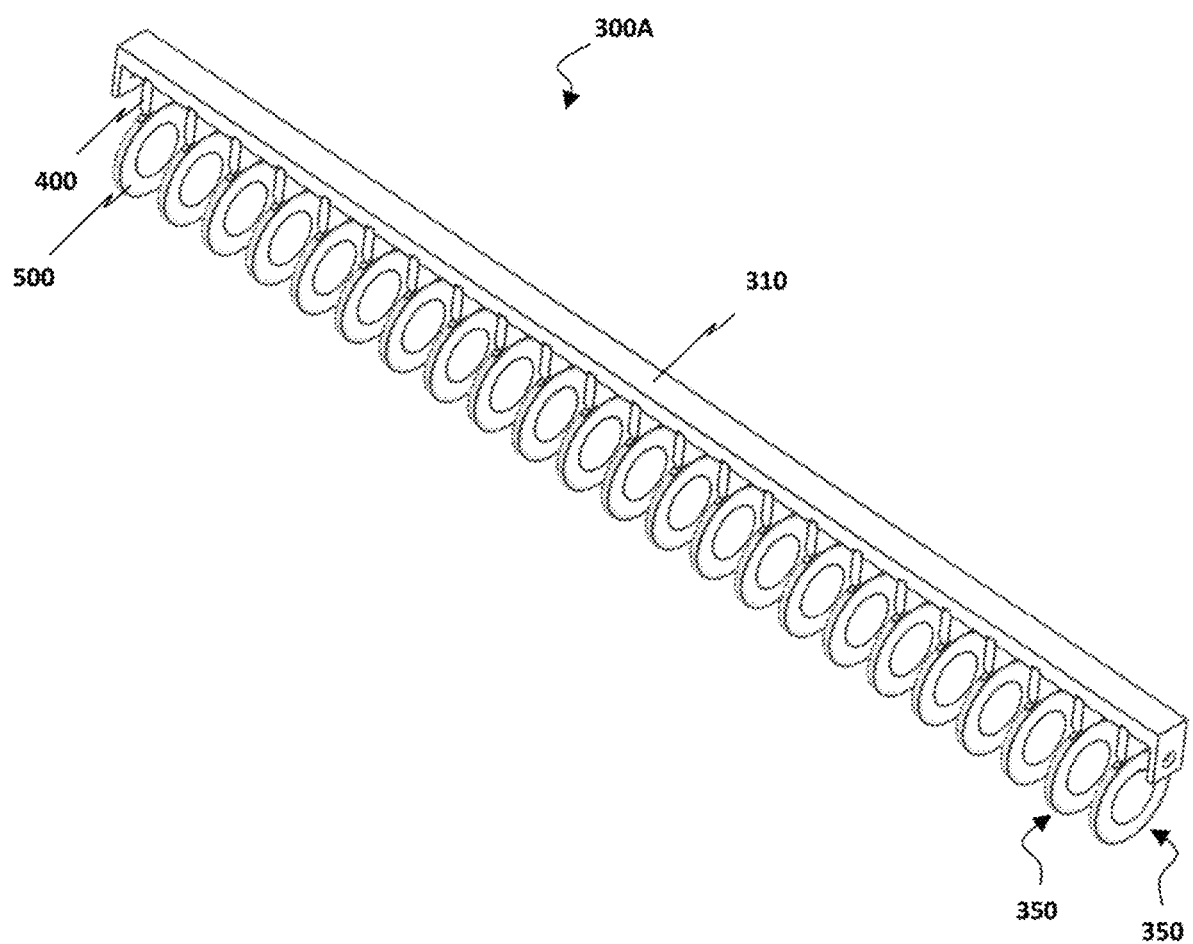
FIGS. 3A-3D is a perspective view, a top view, a front view, and a side view, respectively, of an assembly of synthetic jet devices including a mounting member and a plurality of mounted synthetic jet devices, in accordance with an embodiment of the present disclosure.
Figure 3B:
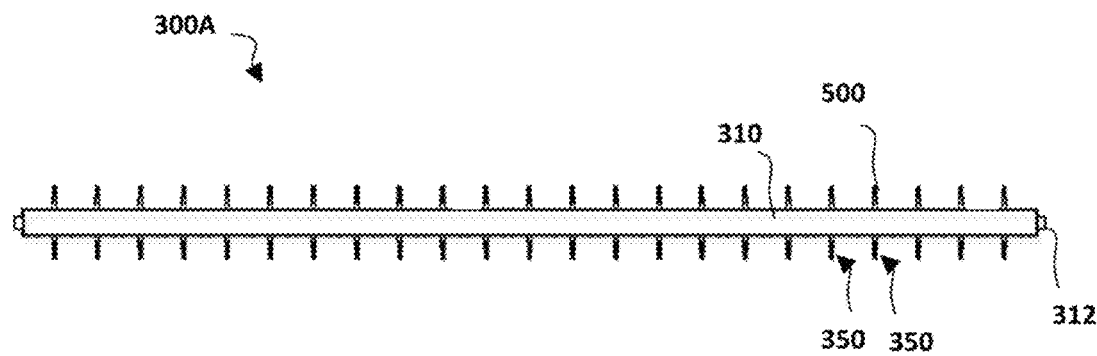
Figure 3C:
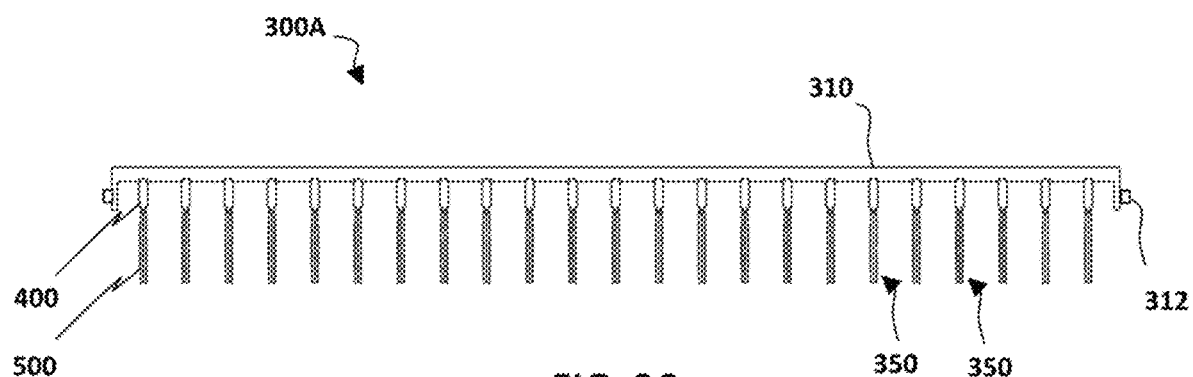
Figure 3D:
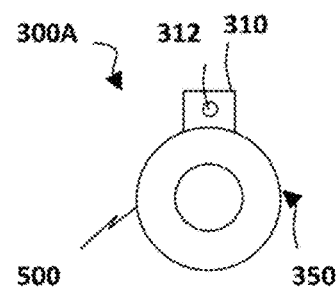

Referring now to FIGS. 2A and 2B, an exemplary synthetic jet device 200 is illustrated expanding/ingesting air and compressing/expelling air, respectively. As will be appreciated, synthetic jet devices, such as the synthetic jet device 200, are zero-net-mass flow devices that include a cavity or volume of air 202 enclosed by at least one flexible plate or membrane 204, and a small aperture 206 through which air can pass. The plates or membranes 204 deform in a periodic or time-harmonic manner causing a corresponding suction and expulsion of air through the aperture 206. As air flows out of the synthetic jet device 200, the air can impinge on a surface 207 of a component 208 to be cooled, where the air convectively cools the surface. Aperture 206 may be oriented perpendicular to, parallel to, or oblique to surface 207 of component 208.

As illustrated in FIG. 2A, the synthetic jet device 200 is undergoing an expanding/ingesting air step. As shown, the plates or membranes 204 are moving in the direction of arrows 212, which increases the volume 202. The expansion of volume 202 reduces the air pressure in volume 202, creating an air pressure differential. The difference in pressure between the volume 202 and the air outside of the aperture 206 attracts the relatively high-pressure air 210 to enter the volume 202, until the pressure equalizes. Once the volume 202 fills with air, the plates or membranes 204 undergoes the compressing/expelling step illustrated in FIG. 2B.

In FIG. 2B the synthetic jet device 200 is undergoing a compressing/expelling step. Specifically, the plates or membranes 204 are moving in the direction of arrows 218. As the plates or membranes 204 move in the direction of the arrows 218 they reduce the volume 202 and create pressure. The increase in pressure creates a pressure differential between air inside the volume 202 and air outside of the aperture 206. The difference in pressure causes the air 216 to flow out of the volume 202 and into the relatively low-pressure location outside the aperture 216, until the pressure equalizes. Then the expanding/ingesting step of FIG. 2A may repeat in a cycle.

As the fluid passes through the aperture or orifice, the edges of the aperture separate the flow to create vortex sheets that roll up into vortices. These vortices move away from the edges of the aperture under their own self-induced velocity. As the mechanism increases the chamber volume, ambient fluid is drawn into the chamber from large distances from the aperture. Since the vortices have already moved away from the edges of the aperture, they are not affected by the ambient fluid entering into the chamber. As the vortices travel away from the aperture, they synthesize a jet of fluid, i.e., a "synthetic jet".

Accordingly, the synthetic jet device 200 imparts a net positive momentum to its external fluid, here ambient air. During each cycle, this momentum manifests as a self-convecting vortex dipole that emanates away from the aperture 206. The vortex dipole then impinges on the surface 207 to be cooled, i.e., heat sinks, microchips, LEDs, memory chips, etc., disturbing the boundary layer and convecting the heat away from its source. Over steady state conditions, this impingement mechanism develops circulation patterns near the heated component and facilitates mixing between the hot air and ambient fluid.

Figure 4:
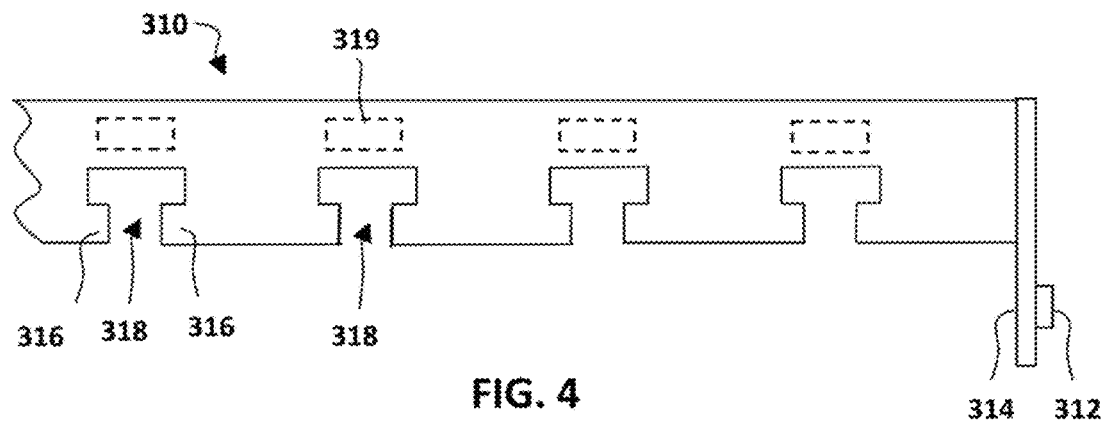
FIG. 4 is a partial front view of a mounting member, in accordance with an embodiment of the present disclosure.

Referring now to FIGS. 3A-3D, a perspective view, a top view, a front view, and a side view, respectively, of an assembly 300A of synthetic jet devices 350 is shown. Assembly 300A includes a mounting member 310 and a plurality of vertically mounted synthetic jet devices 350, in accordance with an embodiment as disclosed herein. FIG. 4 illustrates a partial front view of mounting member 310, in accordance with an embodiment of the present disclosure.

A mounted synthetic jet device 350 includes an extension module 400 operably coupled to mounting member 310 and an actuation module 500 in accordance with an embodiment and as illustrated by block diagram FIG. 1B or 1C in general. However, various synthetic jet devices, such as multi-orifice synthetic jet devices, and single-housed synthetic jet devices as illustrated by block diagram FIG. 1A, may be mounted to be suspended within a channel to be cooled, in accordance with embodiments of the present disclosure.

As shown for example in FIGS. 12A-12C and 15A-15C, mounting member 310 may be operably coupled to a heat sink, and in one embodiment mounting member 310 may be screwed to the top of a heat sink wall with a screw 312, as shown in FIG. 4. Mounting member 310 includes a plurality of pairs of opposed tabs 316 forming slots 318 for receiving an end of extension member 400 of a synthetic jet device 350. Although mounting member 310 is illustrated generally as a straight bar with attachment means to receive extension members 400, mounting member 310 may be formed to have one of various general shapes including but not limited to a line, a curve, a rectangle, and a circle, such that mounted synthetic jet devices may be suspended along the geometric shape of mounting member 310. Mounting member 310 is operably couplable to a heat sink, and in one embodiment may be removably couplable to a heat sink. In one embodiment, mounting member may be coupled to a top area of a heat sink including fin walls, being held in place by an adhesive, an attachment lip 314 and a screw 312, or by various other attachment means.

Mounting member 310 may also include circuitry or wiring 319 (shown by dashed rectangles, FIG. 4) for controlling the function of received synthetic jet devices and/or for connection of a power source or control system to the received synthetic jet devices. In one embodiment, the control circuitry and power source may be electrically connectable with connector 104 (FIG. 1A-1C) of the synthetic jet device.

In one embodiment, circuit 319 may be an ASIC designed specifically for driving the plurality of synthetic jet devices 350. For example, the ASIC may time when the plates of the actuation module flex and how much they flex by controlling the amount and timing of power to the plates. Thus, the plates may bend in sync, out of sync, or one plate may bend more than another plate, etc. It is noted that each of the plurality of synthetic jets 350 may be independently operable or controlled (operating in parallel), that groups of the plurality of synthetic jets 350 may be independently operable or controlled, or that none of the synthetic jet devices 350 are independently controlled (operating in series). In one embodiment, each of the plurality of synthetic jet devices 350 operates at a frequency between about 1 Hz and about 100 kHz for heat sink cooling, and between about 30 kHz and about 100 kHz for heat sink cooling in another embodiment.

Figure 5:
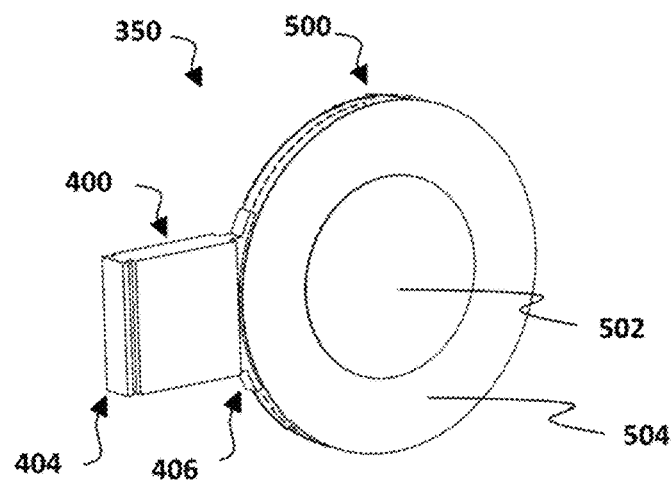
FIG. 5 is a perspective view of a synthetic jet device including an extension module and an actuation module, in accordance with an embodiment of the present disclosure.
Figure 6:
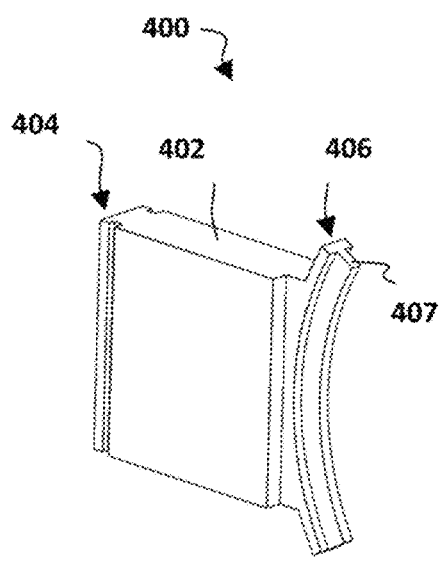
FIG. 6 is a perspective view of an extension module of a synthetic jet device, in accordance with an embodiment of the present disclosure.
Figure 7:
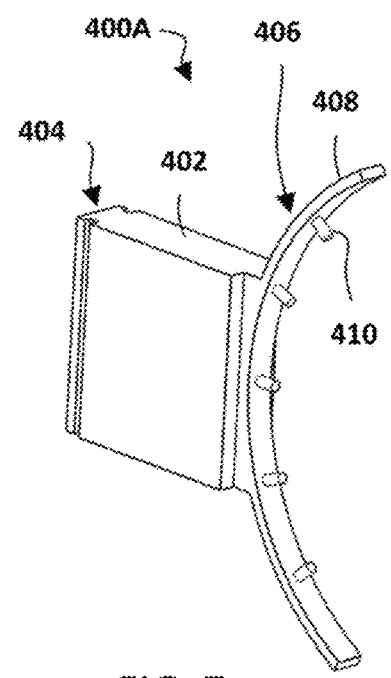
FIG. 7 is a perspective view of another extension module of a synthetic jet device, in accordance with an embodiment of the present disclosure.
Figure 8:
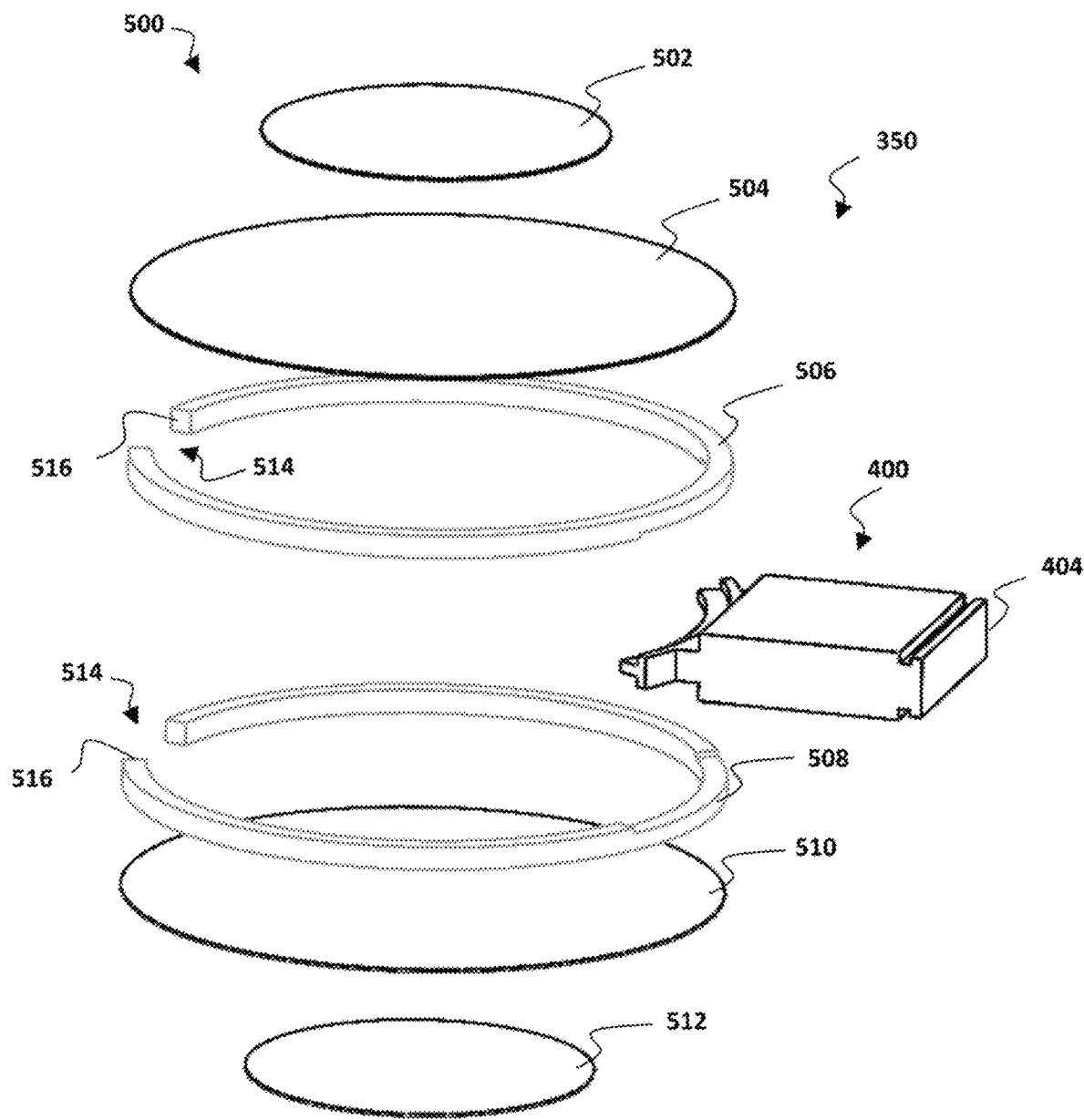
FIG. 8 is an exploded view of some components of a synthetic jet device, in accordance with an embodiment of the present disclosure.
Figure 9:
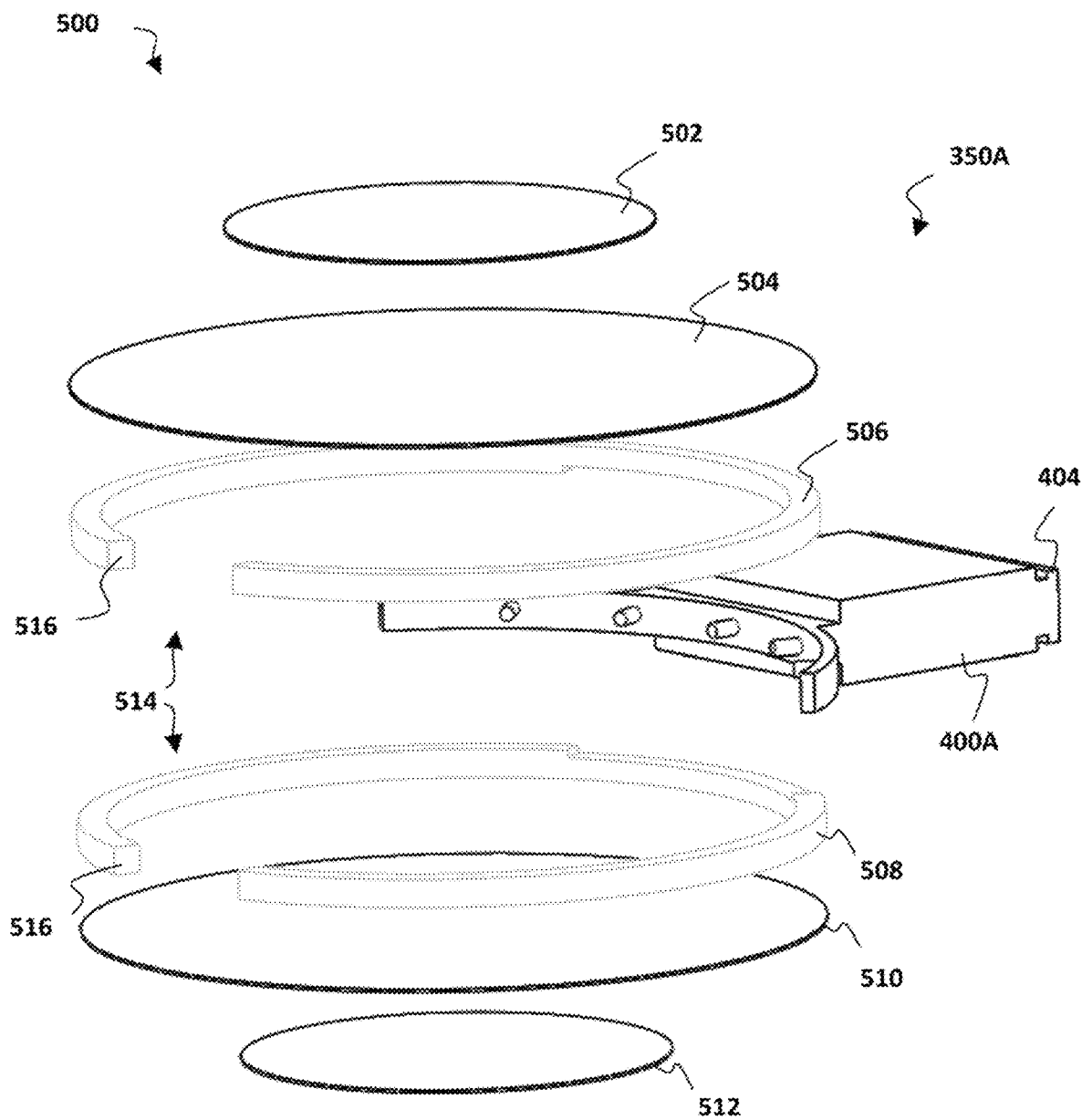
FIG. 9 is another exploded view of some components of a synthetic jet device, in accordance with an embodiment of the present disclosure.

Referring now to FIGS. 5-9, a synthetic jet 350 in accordance with an embodiment is illustrated and described in further detail. FIG. 5 is a perspective view of synthetic jet device 350, which includes extension module 400 and actuation module 500, in accordance with an embodiment as described in the present disclosure. The synthetic jet device illustrated and described with respect to FIG. 1C is directly applicable with this embodiment as illustrated in FIGS. 5-9. FIG. 6 is a perspective view of an extension module 400, in accordance with an embodiment of the present disclosure, and FIG. 7 is a perspective view of alternative extension module 400A, in accordance with an embodiment of the present disclosure. FIG. 8 is an exploded view of some components of synthetic jet device 350 including actuation module 500, in accordance with an embodiment of the present disclosure, and FIG. 9 is another exploded view of some components of an alternative synthetic jet device 350A including actuation module 500, in accordance with an embodiment of the present disclosure. In other embodiments, extension module 400 and actuation module 500 may be manufactured into a single housing and the synthetic jet device illustrated and described with respect to FIG. 1A is applicable. In other embodiments, if a separate housing is operably provided over actuation module 500 (e.g., for protection in some cases), the synthetic jet device illustrated and described with respect to FIG. 1B is applicable.

Extension module 400 includes a body 402 including attachment means at a first end for attaching the body 402 to mounting member 310 and attachment means at a second end for attaching the body 402 to actuation module 500 (e.g., FIGS. 6 and 7). Although body 402 is shown as generally rectangular in shape, body 402 may be formed as other applicable shapes within the scope of the present invention. Body 402 may include top, bottom, and side walls to provide sufficient room to include electronics within the structure for operation of the synthetic jet device in one embodiment, but may also not include electronics or may include wiring for electrical connection to the actuation module.

As noted above, in one embodiment, extension module 400 includes attachment means 404 at a first end of body 402 for mounting the extension module 400 to mounting member 310. Extension module 400 may be removably couplable to mounting member 310, useful for removal of a damaged synthetic jet device. In accordance with one embodiment, attachment means 404 at a first end of body 402 for mounting to mounting member 310 includes parallel tabs and slots (e.g., forming the shape of a T) for removable coupling to tabs 316 and slot 318 of the mounting member 310 (FIG. 4). In one embodiment, tabs 316 and slot 318 are shaped to receive and mate with attachment means 404 of extension module 400. In other embodiments, other attachment means besides tabs and slots are within the scope of the present invention, and various attachment means known in the art may be used to couple the first end of body 402 to mounting member 310, including but not limited to adhesives, nuts and screws, and the like.

As also noted above, extension member 400 further includes attachment means 406 at a second end of body 402 for operably coupling to actuation module 500. In one example, attachment means 404 and 406 are located at opposite ends of body 402 but this is not necessarily the case. The attachment means 406 for operably coupling to actuation module 500 includes a "razor" attachment having a tab or lip 407 in an arcuate shape (FIG. 6) for coupling to frame or spacer rings 506 and 508. Alternatively, attachment means 406 for operably coupling to actuation module 500 includes a "pin" attachment having an arcuate section of a ring 408 with pins 410 (FIG. 7) for attaching to frame or spacer rings 506 and 508. FIG. 8 illustrates razor attachment with arcuate lip 407 for operably attaching to coupled frame or spacer rings 506, 508 of actuation module 500, and FIG. 9 illustrates pin attachment with arcuate 408 includes an arcuate strip with pins 410 for operably attaching to coupled frame or spacer rings 506, 508 of actuation module 500 (FIG. 9).

In accordance with one embodiment, FIGS. 8 and 9 show exploded views of synthetic jet devices 350 and 350A, respectively, including extension modules 400 and 400A and actuation modules 500. Each actuation module 500 includes a first actuator 502 coupled to a first plate 504 arranged opposite and parallel to a second actuator 512 coupled to a second plate 510. First plate 504 is coupled to a first frame or spacer ring 506 and second plate 510 is coupled to a second frame or spacer ring 508. Spacer rings 506 and 508 each include an opening 514 for creation of an orifice or aperture when the rings 506 and 508 are coupled. Spacer rings 506 and 508 are coupled to extension module 400 (FIG. 8) or alternatively extension module 400A (FIG. 9).

Actuators 502 and 512 may be operably coupled to plates 504 and 510, respectively, by an adhesive or glue, silicone, or by various materials and/or means as is known in the art to attach an actuator to a plate and also allow for flexing or vibrating movement of the plate. Actuator 108 may be an electromagnetic actuator, a piezoelectric actuator, a mechanical actuator (i.e., a piston), etc., but in this embodiment, piezoelectric disk actuators 502 and 512 drive actuated members, such as membranes, plates 504 and 510, etc., which are held in position by frame or spacer rings 506 and 508, but which permit flexing or oscillation of the plates.

Plates 504 and 510 may be operably coupled to spacer rings 506 and 508, respectively, with an adhesive, with silicone, by a slot or groove arrangement within the spacer ring to maintain a plate, and/or by various materials and/or means as is known in the art to attach a plate (actuated member) to a spacer (acting as a frame) which still allows flexing or vibrating movement of the plate. A spacer ring may be an elastomeric frame and includes a groove for receiving and holding in place the edges of the plate, in one example. In another example, a flexible adhesive may be used between the spacer ring and the plate to hold in place the edges of the plate while allowing for interference-free deflection of the plate, and in a further example, allowing for the plate to vibrate at its natural frequency (thereby reducing noise).

Furthermore, spacer rings 506 and 508 may be operably coupled to each other and extension module 400 with an adhesive, with silicone, and/or by various materials and/or means as is known in the art. In one example, tab or lip 407 of the razor attachment of extension member 400 may be operably coupled to combined spacer rings 506 and 508 by a slot formed between combined spacer rings 506 and 508 to receive lip 407 (FIGS. 5 and 8). In another example, pins 410 of the pin attachment of extension member 400A may be operably coupled to combined spacer rings 506 and 508 by holes formed between combined spacer rings 506 and 508 to receive pins 410 (FIG. 9).

In one embodiment, the adhesive mentioned above may have a coefficient of thermal expansion between that of the material forming the plates and the spacer rings, and the adhesive may be applied as a continuous section of adhesive or in discrete points or other suitable configuration between parts to be attached. Actuators, plates, and spacer rings are substantially shaped as discs or are circular in nature to advantageously provide for a compact form factor, but other shapes are within the scope of the present invention.

Spacer rings 506 and 508 with plates 504 and 510 when coupled together provide an air cavity which ingests and expels air to provide at least one synthetic jet stream. Advantageously, the spacers and plates come together to form the cavity to ingest and expel air without the need for a separate housing. Thus, the synthetic jet devices 350, 350A have a very thin and planar form factor and profile, with width from the first plate 504 to the second plate 510 on a scale of millimeters in one example (e.g., 1 mm).

Spacer rings 506 and 508 are shown to form a single orifice by openings 514 that is opposite extension module 400/400A, but in other embodiments the openings and therefore the orifice may be formed anywhere on spacers 506 and 508. Furthermore, other actuation modules may include multiple orifices and/or may include orifices oriented to various degrees apart from or relative to the body of extension module 400 or 400A, such that jets may be directed at the heat sink base, fins, and/or other various directions. Furthermore, multiple orifices per synthetic jet device may assist in ingesting and expelling air. Orifices may also be constructed to be of different shapes (rather than a simple channel) depending upon the shape of the opening ends 516 and distance between the ends 516 on the spacer or frame 506, 508. For example, the apertures may be square, rectangular, curved, or other shape.

Although two actuators and actuated members (plates, membranes, and the like) are illustrated, only using one actuator coupled to one actuated member in a synthetic jet device is within the scope of the present invention. Furthermore, using more than two actuators coupled to two respective actuated members are within the scope of the present invention to provide multiple synthetic jet streams from a single synthetic jet device package. In one example, a stiff disk or other separation member may be placed between actuated members and spacers to provide for two or more separate air cavities from which synthetic jet streams may be produced. However, the synthetic jet device should be able to be suspended between and within the channel of heat sink fins without touching a surface of the fins.

As noted above, in one embodiment, extension module 400 may house circuitry (connector 104 and power electronics 106) for operating a corresponding actuation module 500, and in particular for sending signals to actuator 108 (for example actuators 502 and 512) for movement of actuated member 110 (for example plates 504 and 510). In one example, power electronics 106 can operably communicate with actuator 108 via wires (not shown) which can run through or exterior to extension module 400.

Attached to at least one of the first and second plates, or to both of the first and second plates, are actuators configured to cause displacement of the plates. In one example, actuators comprise piezoelectric disks that are configured to periodically receive an electric charge from power electronics 106 (controller), and undergo mechanical stress and/or strain responsive to the charge. The stress/strain of piezoelectric elements cause deflection of the first and/or second plates such that, for example, a time-harmonic motion or vibration of the plates is achieved. It is recognized that the piezoelectric elements coupled to the first and second plates can be selectively controlled to cause vibration of one or both of the plates so as to control the volume and velocity of a synthetic jet stream expelled from the synthetic jet device.

For example, the power electronics 106 may be an ASIC designed specifically for driving the synthetic jet devices 350, 350A. For example, the ASIC may time when the plates 504 and 510 flex and how much they flex by controlling the amount and timing of power to the plates. Thus, the plates may bend in sync, out of sync, or one plate may bend more than another plate, etc. It is noted that each of the plurality of synthetic jets 350, 350A may be independently operable or controlled (operating in parallel), that groups of the plurality of synthetic jets 350 may be independently operable or controlled, or that none of the synthetic jet devices 350 are independently controlled (operating in series). In one embodiment, each of the plurality of synthetic jet devices 350 operates at a frequency between about 1 Hz and about 100 kHz for heat sink cooling, and in another embodiment, each of the plurality of synthetic jets devices 350, 350A operates at a frequency between about 30 kHz and about 100 kHz for heat sink cooling.

In other embodiments, applicable circuitry, such as connector 104 and power electronics 106 for operating a corresponding actuation module 500 may not be housed within extension module 400 but may be housed within mounting member 310, on a printed circuit board (PCB) or motherboard of the device to be cooled, on an exterior surface of the extension module 400, or at another applicable location.

During operation, power exits the power electronics and connects to the actuator (e.g., a piezoelectric actuator) by a first wire, and a second wire is connected to the plate acting as a ground wire. Thus, in one embodiment, two wires can provide power to one actuator and corresponding plate. Additional wires may be used for additional actuator and plate pairs. In one embodiment, as the electricity enters the piezoelectric actuator, the actuator expands, which causes the plate to bend. For example, the actuator may receive sinusoidal power causing the plate to bend sinusoidally up and down. This kind of movement causes the plate(s) to ingest and then expel air out of the air cavity (e.g., cavity or volume 202, FIGS. 2A and 2B), thus providing a cooling airflow.

Figure 10:
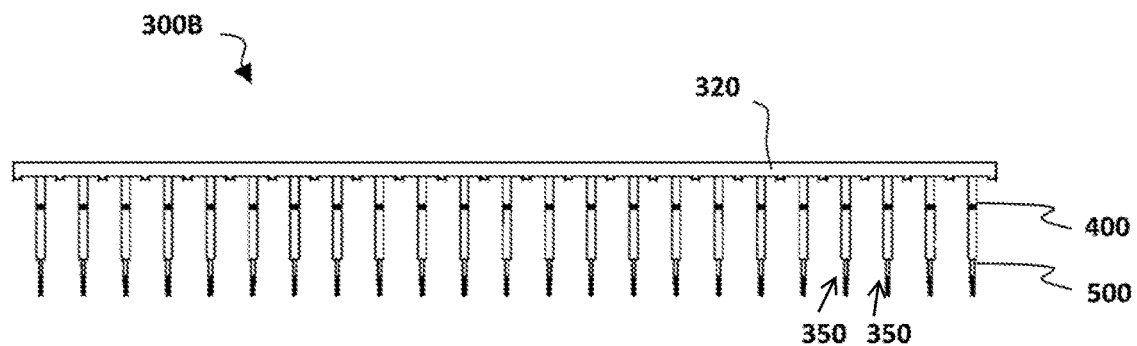
FIGS. 10 and 11 are top views of differently configured assemblies of synthetic jet devices, in accordance with embodiments of the present disclosure.
Figure 11:
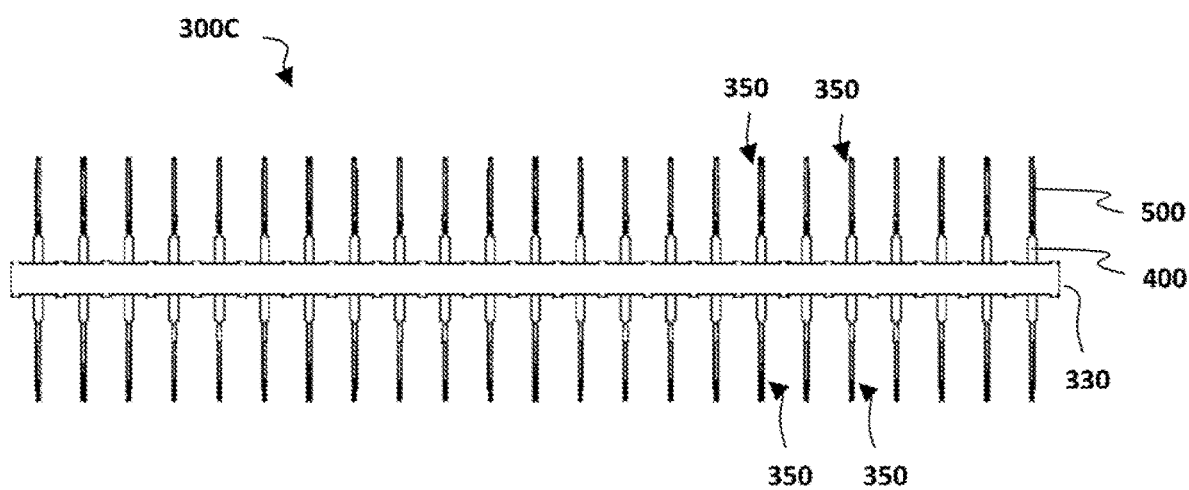

Referring now to FIGS. 10 and 11, top views of differently configured assemblies of synthetic jet devices are shown, in accordance with embodiments of the present disclosure. FIG. 10 illustrates a top view of an assembly 300B of synthetic jet devices 350 horizontally mounted to a mounting member 320. FIG. 11 illustrates a top view of an assembly 300C of synthetic jet devices 350 horizontally mounted to a mounting member 330. As is evident, instead of the synthetic jet devices 350 being suspended vertically with respect to mounting member 310 (in other words the mounting member 310 is vertically above extension module 400, which is vertically above actuation module 500 as in assembly 300A (e.g., FIGS. 3A-D)), FIGS. 10 and 11 illustrate configurations of the synthetic jet devices 350 being suspended sideways or horizontally with respect to mounting members 320 and 330, respectively. In FIG. 10, mounting member 320 is laterally or horizontally adjacent to extension module 400, which is laterally or horizontally adjacent to actuation module 500. FIG. 11 illustrates a configuration of synthetic jet devices 350 mounted horizontally and opposite mounting member 330. Mounting member 330 includes attachment means (e.g., tabs and slots 316, 318) on opposed sides of its body to receive extension member attachment means 404. Thus, pairs of synthetic jet devices 350 are mounted horizontally and opposite one another with respect to mounting member 330.

Referring now to FIGS. 12A-15C, different heat transfer systems including a heat sink with an embedded assembly of synthetic jet devices are shown in accordance with embodiments of the present disclosure.

Figure 12A:
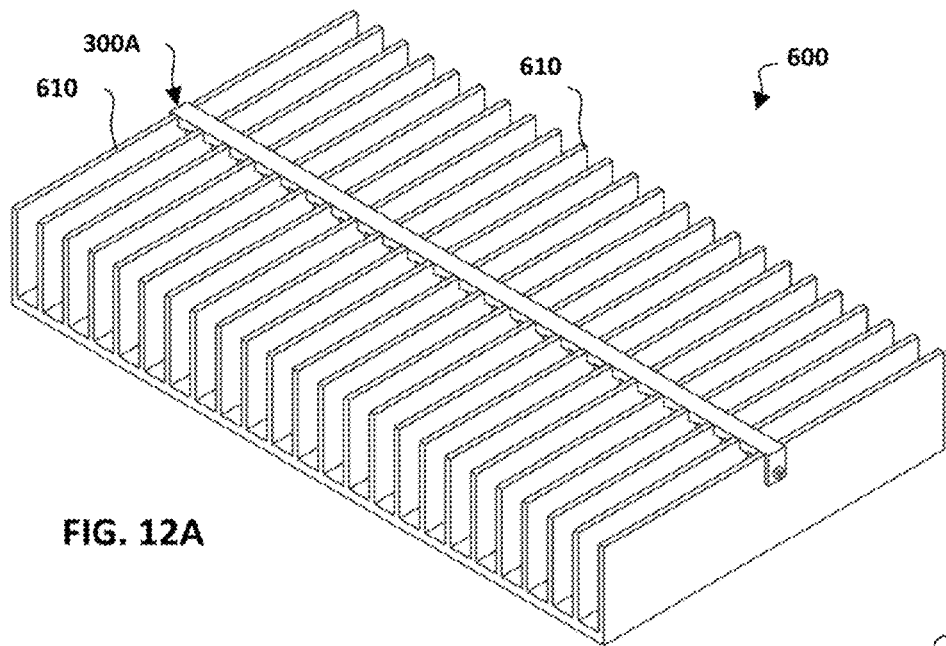
FIGS. 12A-12C are a perspective view, a top view, and a front view, respectively, of a heat transfer system including a heat sink with an embedded assembly of synthetic jet devices, in accordance with an embodiment of the present disclosure.
Figure 12B:
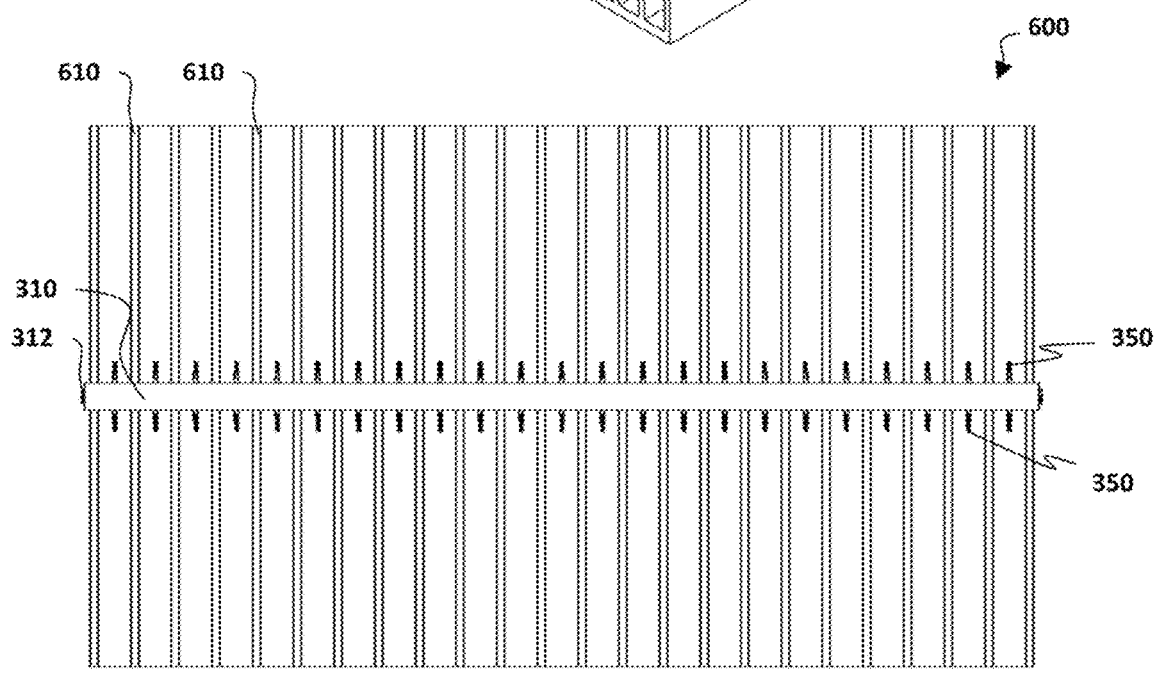
Figure 12C:
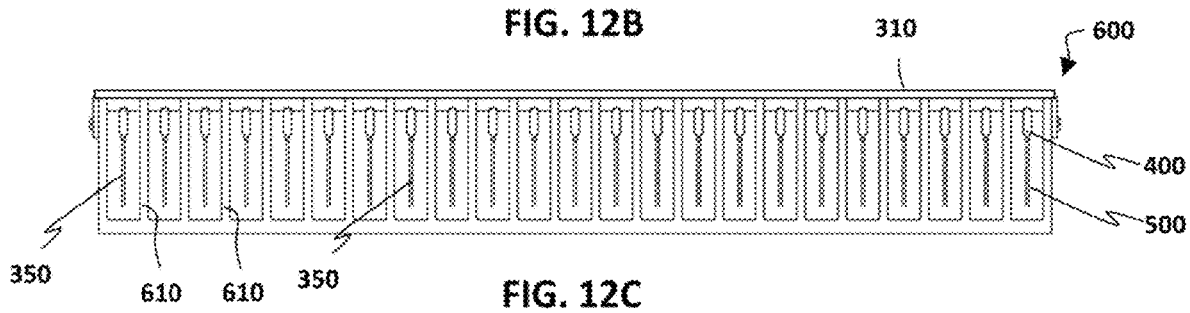

FIGS. 12A-12C are a perspective view, a top view, and a front view, respectively, of a heat transfer system 600 including a heat sink having an array of fins 610 with an embedded assembly 300A of synthetic jet devices 350 between fin channels, in accordance with an embodiment of the present disclosure. The heat sink fins 610 are substantially parallel walls forming parallel channels between two fins in this embodiment, but other configurations of arrays of fins are within the scope of the present invention, and the fins need not be parallel nor shaped in a generally rectangular shape. In one embodiment, the actuation module of a synthetic jet device is suspended completely within the channel created by a pair of adjacent fin walls (i.e., vertically and horizontally within the space created between a pair of adjacent fin walls), and in another embodiment, the entire synthetic jet device (including the actuation module and the extension module) is suspended substantially completely within the channel created by a pair of adjacent fin walls. As noted above, assembly 300A includes synthetic jet devices 350 which are vertically mounted with respect to mounting member 310. However, since a synthetic jet device orifice may be directed along various directions about spacer rings 506, 508, synthetic jets may be directed to various directions within the heat sink channel, including but not limited to being oriented perpendicular to, parallel to, or oblique to a fin wall surface or heat sink base surface.

Figure 13A:
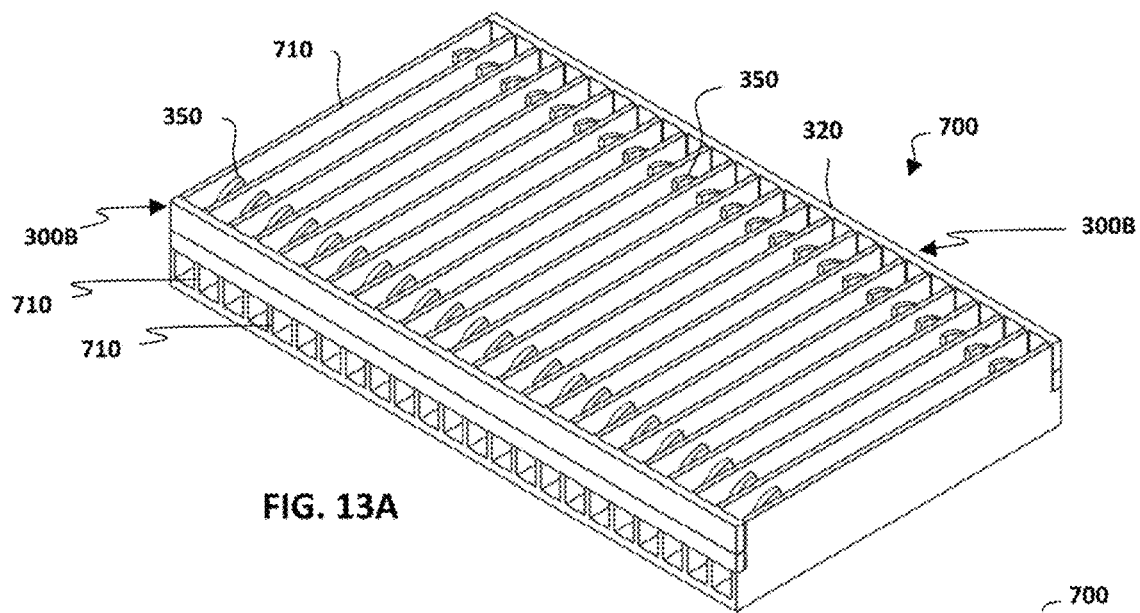
FIGS. 13A-13C are a perspective view, a top view, and a front view, respectively, of another heat transfer system including a heat sink with an embedded assembly of synthetic jet devices, in accordance with an embodiment of the present disclosure.
Figure 13B:
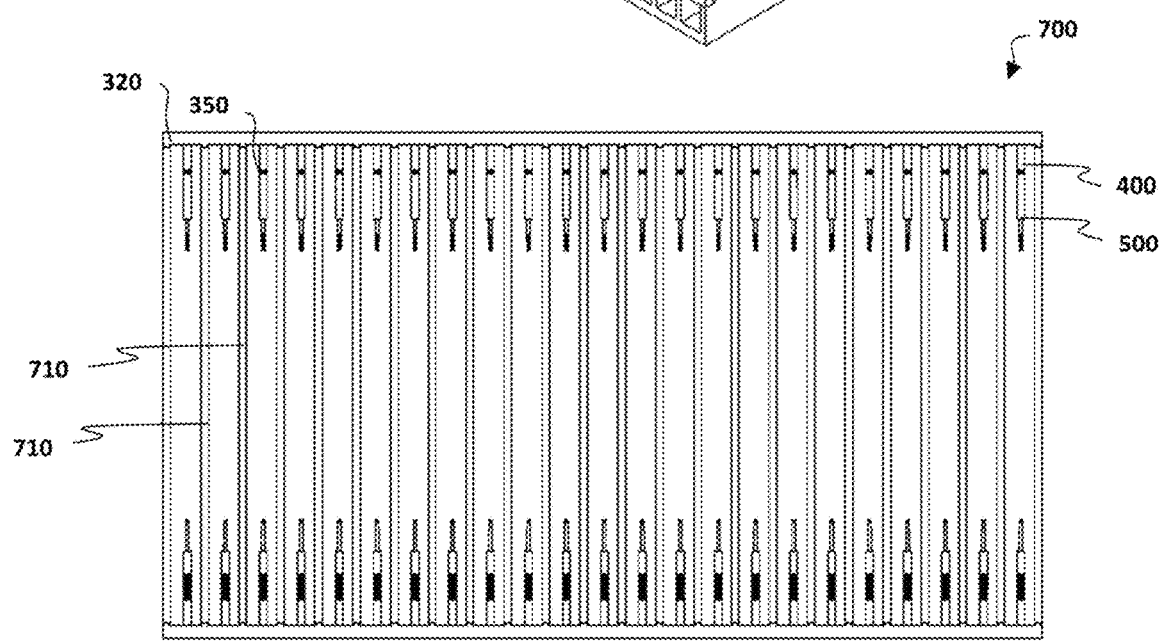
Figure 13C:
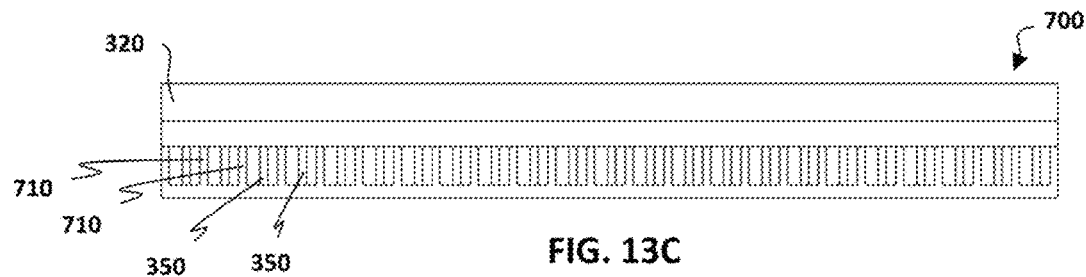

FIGS. 13A-13C are a perspective view, a top view, and a front view, respectively, of a heat transfer system 700 including a heat sink having fins 710 with an embedded assembly 300B of synthetic jet devices 350, in accordance with an embodiment of the present disclosure.

Figure 14A:
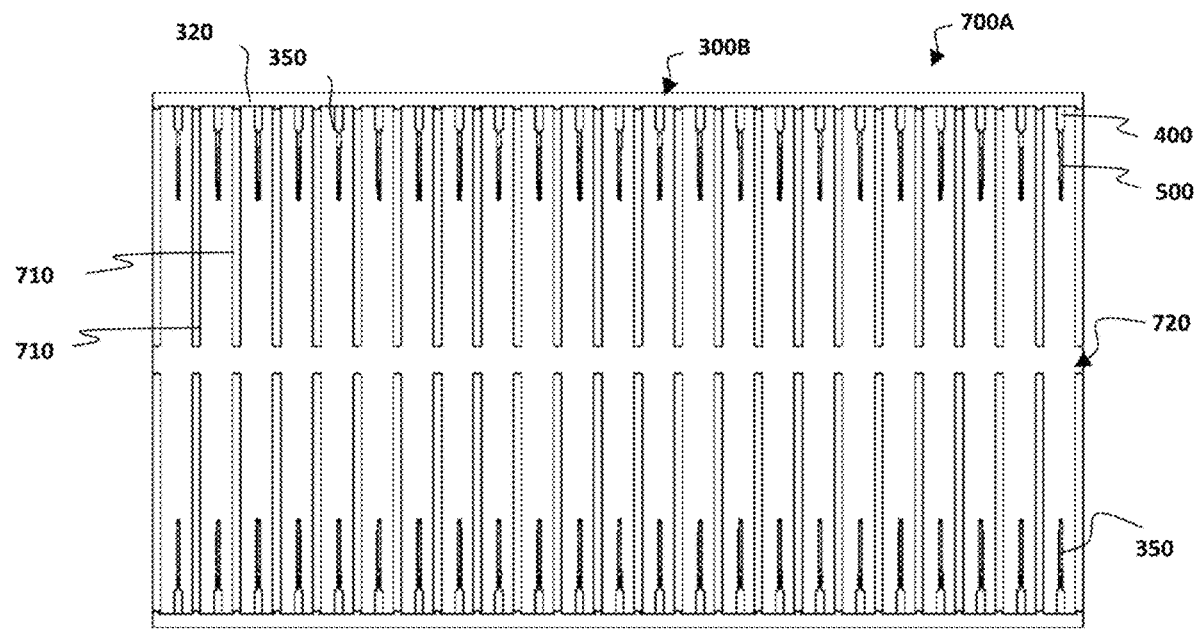
FIGS. 14A-14B are a top view and a front view, respectively, of another heat transfer system including a heat sink with an embedded assembly of synthetic jet devices, in accordance with an embodiment of the present disclosure.
Figure 14B:
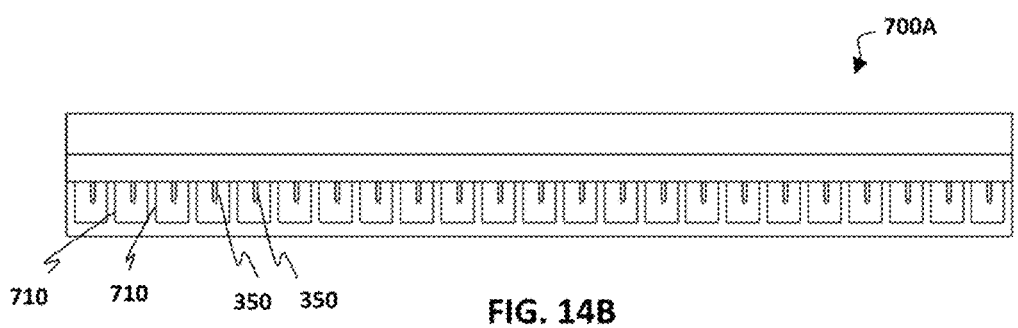

FIGS. 14A-14B are a top view and a front view, respectively, of a heat transfer system 700A including a heat sink having fins 710 with an embedded assembly 300B of synthetic jet devices 350, in accordance with an embodiment of the present disclosure. Differently from heat transfer system 700, heat transfer system 700A includes a heat sink with a center slot 720 running through fins 710.

Figure 15A:
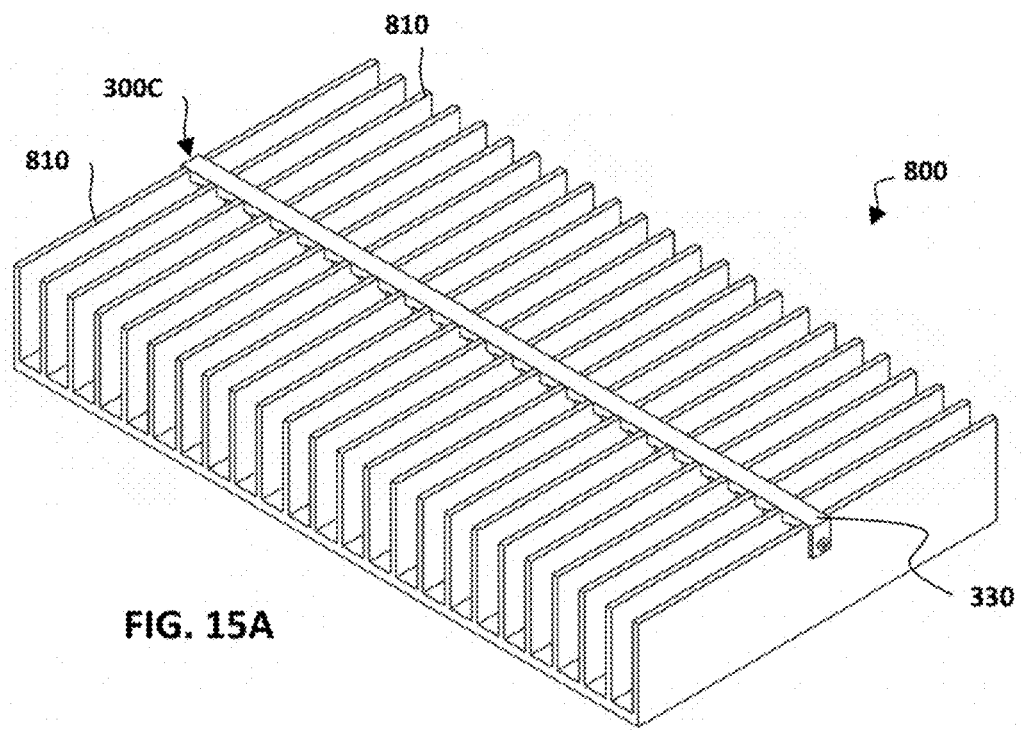
FIGS. 15A-15C are a perspective view, a top view, and a front view, respectively, of another heat transfer system including a heat sink with an embedded assembly of synthetic jet devices, in accordance with an embodiment of the present disclosure.
Figure 15B:
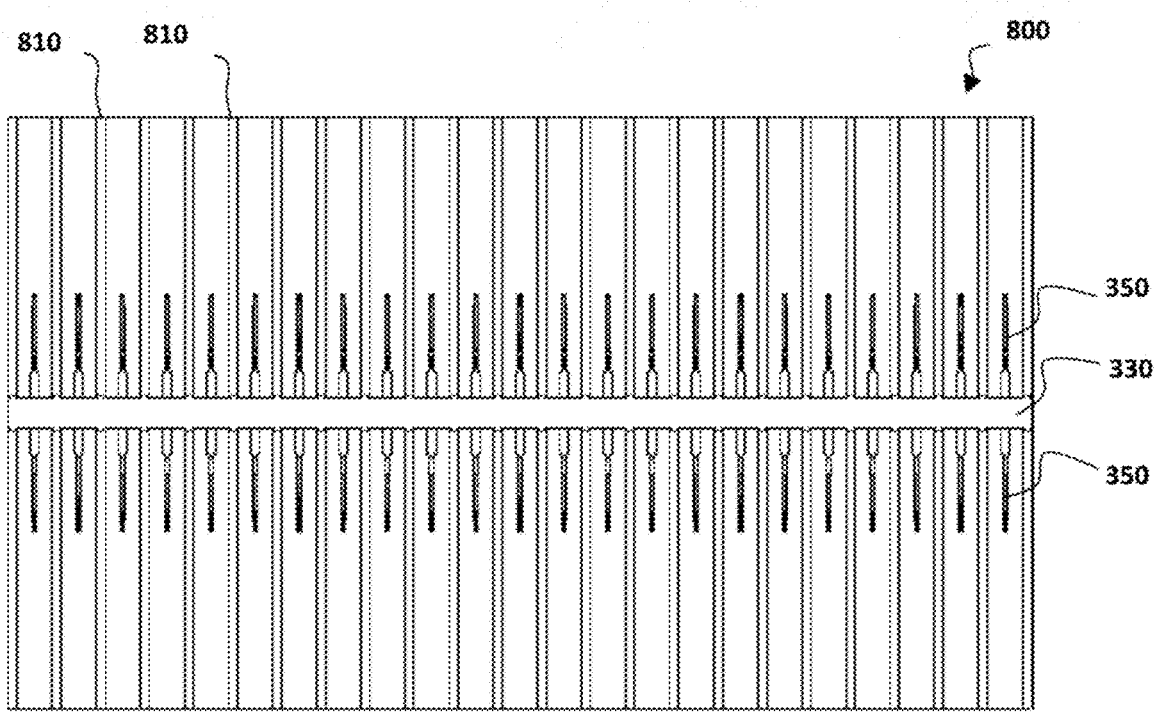
Figure 15C:
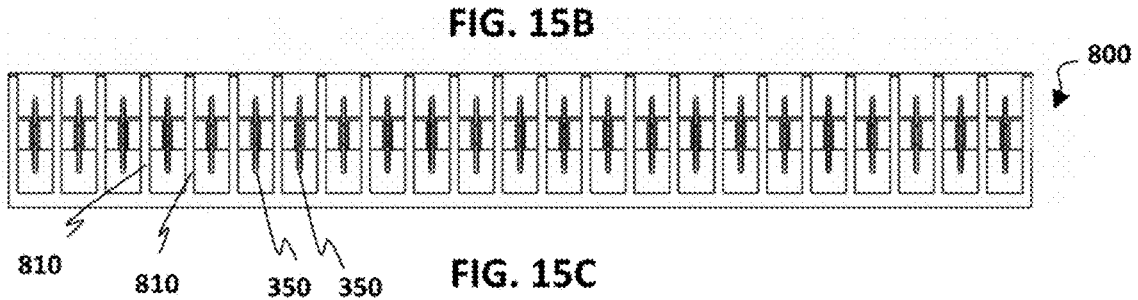

FIGS. 15A-15C are a perspective view, a top view, and a front view, respectively, of a heat transfer system 800 including a heat sink having fins 810 with an embedded assembly 300C of synthetic jet devices 350, in accordance with an embodiment of the present disclosure.

As illustrated in these heat transfer systems 600, 700, 700A, and 800, each of the plurality of synthetic jet devices 350 may be positioned completely within a channel between two of the plurality of fins of the heat sink. The heat sink fins are substantially parallel walls forming parallel channels between two fins in the above-described embodiments, but other configurations of arrays of fins are within the scope of the present invention, and the fins need not be parallel nor shaped in a generally rectangular shape. It is also noted that although plates of heat sink fins are illustrated, the plurality of heat sink fins may be various pin fins and they may be of various shape, size, material and array layout.

In one embodiment, each of the plurality of synthetic jet devices 350 may be suspended substantially completely within a channel (bounded vertically and horizontally within the space created by the heat sink fins) to advantageously provide a minimum form factor and highly compact heat transfer system. In one embodiment, the actuation module of a synthetic jet device is suspended completely within the channel created by a pair of adjacent fin walls (i.e., vertically and horizontally within the space created between a pair of adjacent fin walls), and in another embodiment, the entire synthetic jet device (including the actuation module and the extension module) is suspended substantially completely within the channel created by a pair of adjacent fin walls. According to yet another embodiment, each of the plurality of synthetic jets is arranged to be positioned within a different channel between different pairs of the plurality of fins of the heat sink.

As is shown, the plurality of synthetic jet devices may be configured to include orifices aligned in a same direction (FIG. 12A-12C) and orifices aligned opposite to one another (FIGS. 13A-13C, 14A-14B, and 15A-15C). In other embodiments, the plurality of synthetic jet devices may be configured to have orifices aligned in multiple different directions. According to one embodiment each of the synthetic jet devices 350 may be configured to direct a synthetic jet stream along a longitudinal length of the channel of the heat sink. In yet other embodiments, each of the synthetic jet devices may have multiple orifices for providing multiple jet flows in multiple directions from a single synthetic jet device. Thus, it is evident that jets of air may be directed at different angles such that jets may be directed at fins, a heat sink base, or multiple locations of the heat sink. Thus, synthetic jets may be directed to various directions within the heat sink channel, including but not limited to being oriented perpendicular to, parallel to, or oblique to a fin wall surface or heat sink base surface.

Figure 16:
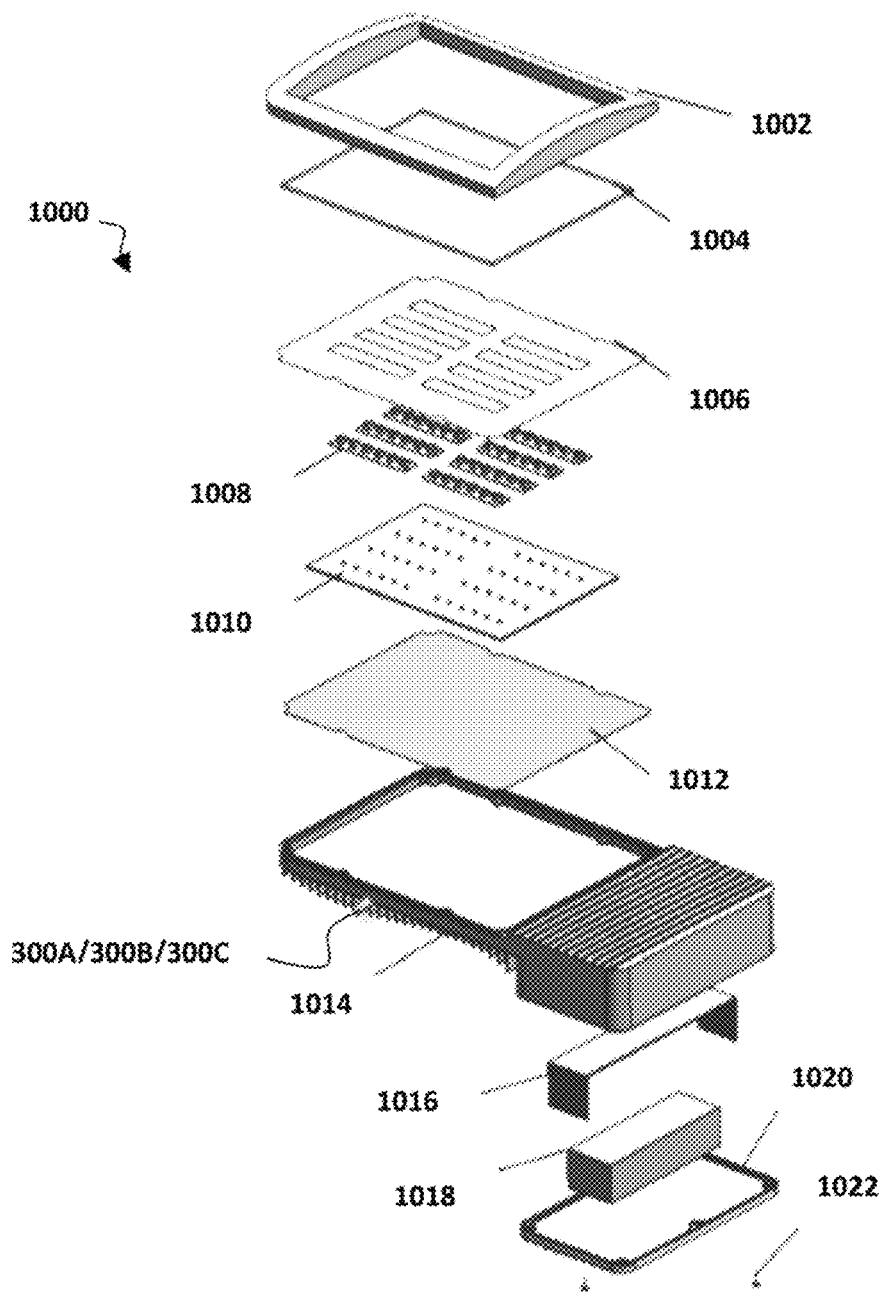
FIGS. 16 and 17 illustrate an assembly view and a perspective view, respectively, of different lamp heat sinks with an embedded assembly of synthetic jet devices, in accordance with embodiments of the present disclosure.
Figure 17:
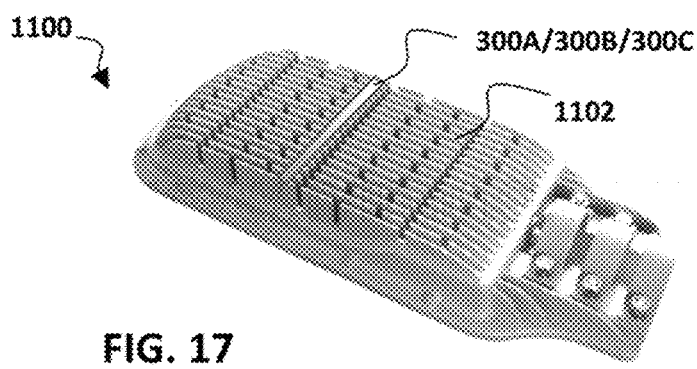

FIGS. 16 and 17 illustrate an assembly view and perspective view, respectively, of different heat sinks with an embedded assembly of synthetic jet devices coupled to a lamp heat source, in accordance with embodiments of the present disclosure. FIG. 16 illustrates an assembly view of a lamp 1000 including a frame 1002, a glass 1004, a white reflector 1006, a PC optic transparent 1008, an LED printed circuit board and LED chips 1010, a thermal interface material 1012, a main body with heat sink 1014, a metal platform 1016, a power box driver 1018, and a back lid 1020 with screws 1022. FIG. 17 illustrates a perspective view of a lamp 1100 including a heat sink 1102 thermally coupled to a lamp heat source for cooling the lamp. It is noted that thermal interface material 1012 can more evenly spread heat from a heat source over the base of a heat sink, and such plates or piping to spreading heat over a base of a heat sink may be applied to heat sinks within the scope of the present invention.

An assembly of synthetic jet devices 300A, 300B, 300C, or a combination of assemblies are advantageously embedded within heat sinks 1014 and 1102 such that actuation modules of synthetic jet devices are suspended (for example, vertically and/or horizontally and/or in other orientations) within channels of the heat sink. Because the synthetic jet devices are mounted to be substantially suspended within the heat sink channels, a highly compact form factor for the heat sink is possible.

In yet another embodiment, a method of heat transfer includes providing a heat sink including a plurality of fins, providing a mounting member, and providing a plurality of synthetic jet devices as described above. The method further includes operably coupling a plurality of synthetic jet devices to the mounting member via the extension module, operably coupling the mounting member to the heat sink, and suspending each of the plurality of synthetic jet devices within a channel between two fins of the plurality of fins. It is possible that the method steps may be ordered differently within the scope of the present invention. For example, it is possible that the mounting member is first coupled to the heat sink and then the synthetic jet devices are coupled to the mounting member.

Although the invention has been described in detail in connection with only a limited number of embodiments, it should be readily understood that the invention is not limited to such disclosed embodiments. Rather, the invention can be modified to incorporate a number of variations, alterations, substitutions or equivalent arrangements not heretofore described, but which are commensurate with the spirit and scope of the invention. For example, multi-orifice synthetic jet devices at various angles as well as other various synthetic jet devices may be suspended between heat sink walls within the scope of the present invention. Additionally, while various embodiments of the invention have been described, it is to be understood that aspects of the invention may include only some of the described embodiments. Accordingly, the invention is not to be seen as limited by the foregoing description but is only limited by the scope of the appended claims.

The invention claimed is:

1. An assembly of synthetic jet devices comprising:
a mounting member for coupling to a heat sink including a plurality of fins, the mounting member has pairs of opposed tabs forming slots; and
a plurality of synthetic jet devices, each of said plurality of synthetic jet devices comprising:
an actuation module having a first actuator and a first plate opposite a second actuator and a second plate; and
an extension module operably coupling said actuation module to said mounting member, wherein said actuation module of each of said plurality of synthetic jet devices is configured to be suspended within a channel between adjacent respective fins of the plurality of fins, wherein a respective one of the slots of said mounting member receives the extension module, the extension module being operably coupled to the actuation module.

2. The assembly of synthetic jet devices of claim 1, wherein said plurality of synthetic jet devices have an alignment of orifices selected from the group consisting of: the orifices aligned in a same direction, the orifices aligned in different directions, and the orifices aligned opposite to one another.

3. The assembly of synthetic jet devices of claim 1, wherein each of said plurality of synthetic jet devices is arranged to be suspended within a different channel between a different adjacent pair of the plurality of fins of the heat sink, and further wherein each of said plurality of synthetic jet devices is arranged to be suspended completely within bounds of the different channel.

4. The assembly of synthetic jet devices of claim 1, wherein each of said plurality of synthetic jet devices operates at a frequency between 1 Hz and 100 kHz.

5. The assembly of synthetic jet devices of claim 1, wherein each of said plurality of synthetic jet devices is suspended vertically or horizontally within the channel.

6. A heat transfer system comprising:
a heat sink having a plurality of fins; and
a synthetic jet assembly operably coupled to said heat sink, said synthetic jet assembly comprising:
a mounting member operably coupled to said heat sink, said mounting member has pairs of opposed tabs forming slots, and
a plurality of synthetic jet devices operably coupled to said mounting member, each of said plurality of synthetic jet devices is suspended within a channel between adjacent respective fins of the plurality of fins, each of said plurality of synthetic jet devices having:
an actuation module having a first actuator and a first plate opposite a second actuator and a second plate, and
an extension module operably coupling the actuation module to said mounting member, wherein a respective one of the slots of said mounting member receives the extension module, the extension module being operably coupled to the actuation modules.

7. The heat transfer system of claim 6, wherein each of said plurality of synthetic jet devices is arranged to be suspended within a different adjacent pair of the plurality of fins of the heat sink, and further wherein each of said plurality of synthetic jet devices is arranged to be suspended within bounds of the channel.

8. The heat transfer system of claim 6, wherein each of said plurality of synthetic jet devices operates at a frequency between 30 kHz and 100 kHz.

9. The heat transfer system of claim 6, further comprising:
a heat source thermally coupled to the heat sink, wherein said heat source has one of a light emitting diode (LED) and a printed circuit board (PCB).

10. A method of heat transfer comprising:
providing a heat sink having a plurality of fins;
providing a mounting member, the mounting member has pairs of opposed tabs forming slots;
providing a plurality of synthetic jet devices, each of the plurality of synthetic jet devices comprising:
an actuation module having a first actuator and a first plate opposite a second actuator and a second plate, and
an extension module operably coupled to the actuation module;
operably coupling said plurality of synthetic jet devices to the mounting member via the extension module, wherein a respective one of the slots of the mounting receives the extension module, the extension module being operably coupled to the actuation module;
operably coupling the mounting member to the heat sink; and
suspending each of the plurality of synthetic jet devices within a channel between adjacent respective fins of the plurality of fins.

11. The method of claim 10, further comprising:
operating each of the plurality of synthetic jet devices at a frequency between 30 kHz and 100 kHz to cool the heat sink.

12. An assembly of synthetic jet devices comprising:
a mounting member for coupling to a heat sink including a plurality of fins; and
a plurality of synthetic jet devices, each of said plurality of synthetic jet devices comprising:
an actuation module having a first actuator and a first plate opposite a second actuator and a second plate; and
an extension module operably coupling said actuation module to said mounting member, wherein said actuation module of each of said plurality of synthetic jet devices is configured to be suspended within a channel between adjacent respective fins of the plurality of fins, wherein said mounting member has circuitry for controlling a function of said plurality of synthetic jet devices.

13. A heat transfer system comprising:
a heat sink having a plurality of fins; and
a synthetic jet assembly operably coupled to said heat sink, said synthetic jet assembly comprising:
a mounting member operably coupled to said heat sink, and
a plurality of synthetic jet devices operably coupled to said mounting member, each of said plurality of synthetic jet devices is suspended within a channel between adjacent respective fins of the plurality of fins, each of the plurality of synthetic jet devices having:
an actuation module having a first actuator and a first plate opposite a second actuator and a second plate, and
an extension module operably coupling the actuation module to said mounting member,
wherein said mounting member has circuitry for controlling a function of the plurality of synthetic jet devices.

14. A method of heat transfer comprising;
providing a heat sink having a plurality of fins;
providing a mounting member;
providing a plurality of synthetic jet devices, each of the plurality of synthetic devices comprising:
an actuation module having a first actuator and a first plate opposite a second actuator and a second plate; and
an extension module operably coupled to the actuation module;
operably coupling the plurality of synthetic jet devices to the mounting member via the extension module, wherein the mounting member has circuitry for controlling a function of the plurality of synthetic jet devices;
operably coupling the mounting member to the heat sink; and
suspending each of the plurality of synthetic jet devices within a channel between adjacent respective fins of the plurality of fins.

15. An assembly of synthetic jet devices comprising:
a mounting member for coupling to a heat sink including a plurality of fins; and
a plurality of synthetic jet devices, each of said plurality of synthetic jet devices comprising:
an actuation module having a first actuator and a first plate opposite a second actuator and a second plate; and
an extension module operably coupling said actuation module to said mounting member, wherein said actuation module of each of said plurality of synthetic jet devices is configured to be suspended within a channel between adjacent respective fins of the plurality of fins, wherein said extension module has circuitry for operating the actuation module.

16. A heat transfer system comprising:
a heat sink having a plurality of fins; and
a synthetic jet assembly operably coupled to said heat sink, said synthetic jet assembly comprising:
a mounting member operably coupled to said heat sink, and
a plurality of synthetic jet devices operably coupled to said mounting member, each of said plurality of synthetic jet devices is suspended within a channel between adjacent respective fins of the plurality of fins, each of the plurality of synthetic jet devices having:
an actuation module, the actuation module has a first actuator and a first plate opposite a second actuator and a second plate, and
an extension module operably coupling the actuation module to said mounting member, the extension module has circuitry for operating the actuation module.

17. A method of heat transfer comprising;
providing a heat sink having a plurality of fins;
providing a mounting member;
providing a plurality of synthetic jet devices, each of the plurality of synthetic devices comprising:
an actuation module having a first actuator and a first plate opposite a second actuator and a second plate; and
an extension module has circuitry for operating the actuation module;
operably coupling the plurality of synthetic jet devices to the mounting member via the extension module;
operably coupling the mounting member to the heat sink; and
suspending each of the plurality of synthetic jet devices within a channel between adjacent respective fins of the plurality of fins.

* * * * *